(12) United States Patent
Kim et al.

(10) Patent No.: US 10,215,373 B2
(45) Date of Patent: Feb. 26, 2019

(54) LIGHTING APPARATUS

(71) Applicant: SAMSUNG ELECTRONICS CO., LTD., Suwon-si, Gyeonggi-do (KR)

(72) Inventors: Dong Hyuk Kim, Seoul (KR); June Jang, Seoul (KR); Jin Sun Jung, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 22 days.

(21) Appl. No.: 15/364,571

(22) Filed: Nov. 30, 2016

(65) Prior Publication Data
US 2017/0292683 A1 Oct. 12, 2017

(30) Foreign Application Priority Data

Apr. 6, 2016 (KR) .......................... 10-2016-0041979

(51) Int. Cl.
*F21V 17/02* (2006.01)
*F21V 3/02* (2006.01)
*F21V 7/04* (2006.01)
*F21V 15/015* (2006.01)
*F21V 23/00* (2015.01)
(Continued)

(52) U.S. Cl.
CPC ............... *F21V 17/02* (2013.01); *F21S 2/00* (2013.01); *F21S 4/28* (2016.01); *F21V 3/02* (2013.01); *F21V 7/04* (2013.01); *F21V 15/015* (2013.01); *F21V 17/14* (2013.01); *F21V 19/003* (2013.01); *F21V 23/005* (2013.01); *F21V 23/06* (2013.01); *F21K 9/272* (2016.08); *F21K 9/275* (2016.08); *F21K 9/278* (2016.08);

*F21V 29/74* (2015.01); *F21Y 2103/10* (2016.08); *F21Y 2115/10* (2016.08); *H01L 2224/48091* (2013.01);
(Continued)

(58) Field of Classification Search
CPC . F21V 17/02; F21V 17/14; F21V 3/02; F21V 15/015; F21V 23/06; F21V 7/04; F21V 23/005; F21V 19/0025; F21V 19/0045; F21V 19/003; F21S 4/28; F21S 2/00; H01L 33/382; F21Y 2103/10; F21K 9/272; F21K 9/278; F21K 9/275
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2007-059674 A 3/2007
JP 2010-003683 A 1/2010
(Continued)

*Primary Examiner* — Y M. Lee
(74) *Attorney, Agent, or Firm* — Lee & Morse P.C.

(57) ABSTRACT

A lighting apparatus includes a fixture having a fastening hole, the fastening hole including a first portion and a second portion connected to each other, and the second portion having a width smaller than a diameter of the first portion, a light source module having a fastening pin detachably fastened to the fastening hole, and an electrode terminal on the fixture and connected to the light source module, wherein the light source module is slidably moveable along a surface of the fixture, as the fastening pin is moveable within the fastening hole from the first portion to the second portion.

16 Claims, 19 Drawing Sheets

(51) Int. Cl.
   F21V 23/06   (2006.01)
   F21S 2/00    (2016.01)
   F21V 17/14   (2006.01)
   F21V 19/00   (2006.01)
   F21S 4/28    (2016.01)
   F21V 29/74       (2015.01)
   F21K 9/272       (2016.01)
   F21K 9/275       (2016.01)
   F21K 9/278       (2016.01)
   F21Y 115/10      (2016.01)
   F21Y 103/10      (2016.01)

(52) U.S. Cl.
   CPC ............... *H01L 2224/48247* (2013.01); *H01L 2224/49107* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,988,336 B1 * | 8/2011 | Harbers et al. ........... F21K 9/00 362/294 |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,109,652 B2 * | 2/2012 | Chen ................... F21V 19/0045 362/218 |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,668,352 B2 | 3/2014 | Park et al. |
| 8,735,931 B2 | 5/2014 | Han et al. |
| 8,764,220 B2 | 7/2014 | Chan et al. |
| 8,766,295 B2 | 7/2014 | Kim |
| 2010/0265705 A1 | 10/2010 | Fang et al. |
| 2011/0083894 A1 | 4/2011 | Kopf |
| 2011/0114977 A1 * | 5/2011 | Miura ................... F21V 15/013 257/91 |
| 2011/0291594 A1 * | 12/2011 | Tanaka ................ F21V 19/0005 362/362 |
| 2012/0195032 A1 | 8/2012 | Shew |
| 2013/0208477 A1 * | 8/2013 | Wang ..................... F21V 19/04 362/249.04 |
| 2013/0229802 A1 * | 9/2013 | Fukushima ........... F21V 19/003 362/235 |
| 2014/0204572 A1 | 7/2014 | Spinelli |
| 2014/0299893 A1 | 10/2014 | Weng |

FOREIGN PATENT DOCUMENTS

| | | |
|---|---|---|
| JP | 2010-171340 A | 8/2010 |
| KR | 10-2012-0104046 A | 9/2012 |

* cited by examiner

LIGHTING APPARATUS

CROSS-REFERENCE TO RELATED APPLICATION

Korean Patent Application No. 10-2016-0041979, filed on Apr. 6, 2016, in the Korean Intellectual Property Office, and entitled: "Lighting Apparatus," is incorporated by reference herein in its entirety.

BACKGROUND

1. Field

Embodiments relate to a lighting apparatus.

2. Description of the Related Art

A lighting apparatus may be manufactured using processes of fastening substrates, on which a light emitting device is mounted, to a frame, and additionally fastening an optical element, e.g., a lens covering the light emitting device, or the like, to the frame. In this case, the fastening of the substrate and the optical element may be performed using a screw fastening method.

SUMMARY

According to an aspect of embodiments, a lighting apparatus may include a fixture having a fastening hole, the fastening hole including a first portion and a second portion connected to each other, and the second portion having a width smaller than a diameter of the first portion, a light source module having a fastening pin detachably fastened to the fastening hole, and an electrode terminal on the fixture and connected to the light source module, wherein the light source module is slidably moveable along a surface of the fixture, as the fastening pin is moveable within the fastening hole from the first portion to the second portion.

According to another aspect of embodiments, a lighting apparatus may include a fixture having a fastening hole, a light source module including a plurality of light emitting devices on a first surface of the substrate, a fastening pin protruding from the substrate to be detachably fastened to the fastening hole, and an electrode terminal on the fixture and connected to the light source module, wherein the substrate is slidably moveable on a surface of the fixture, while the fastening pin is moveable within the fastening hole.

According to yet another aspect of embodiments, a lighting apparatus may include a fixture having a fastening hole, the fastening hole including a first portion and a second portion connected to each other, and the second portion having a width smaller than a diameter of the first portion, a light source module on the fixture, the light source module having a fastening pin detachably fastened to the fastening hole in the fixture, the fastening pin being moveable within the fastening hole from the first portion to the second portion, and an electrode terminal on the fixture, the electrode terminal being electrically connected to the light source module when the fastening pin is in the second portion.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Embodiments will now be described in detail with reference to the accompanying drawings.

Figure 1:
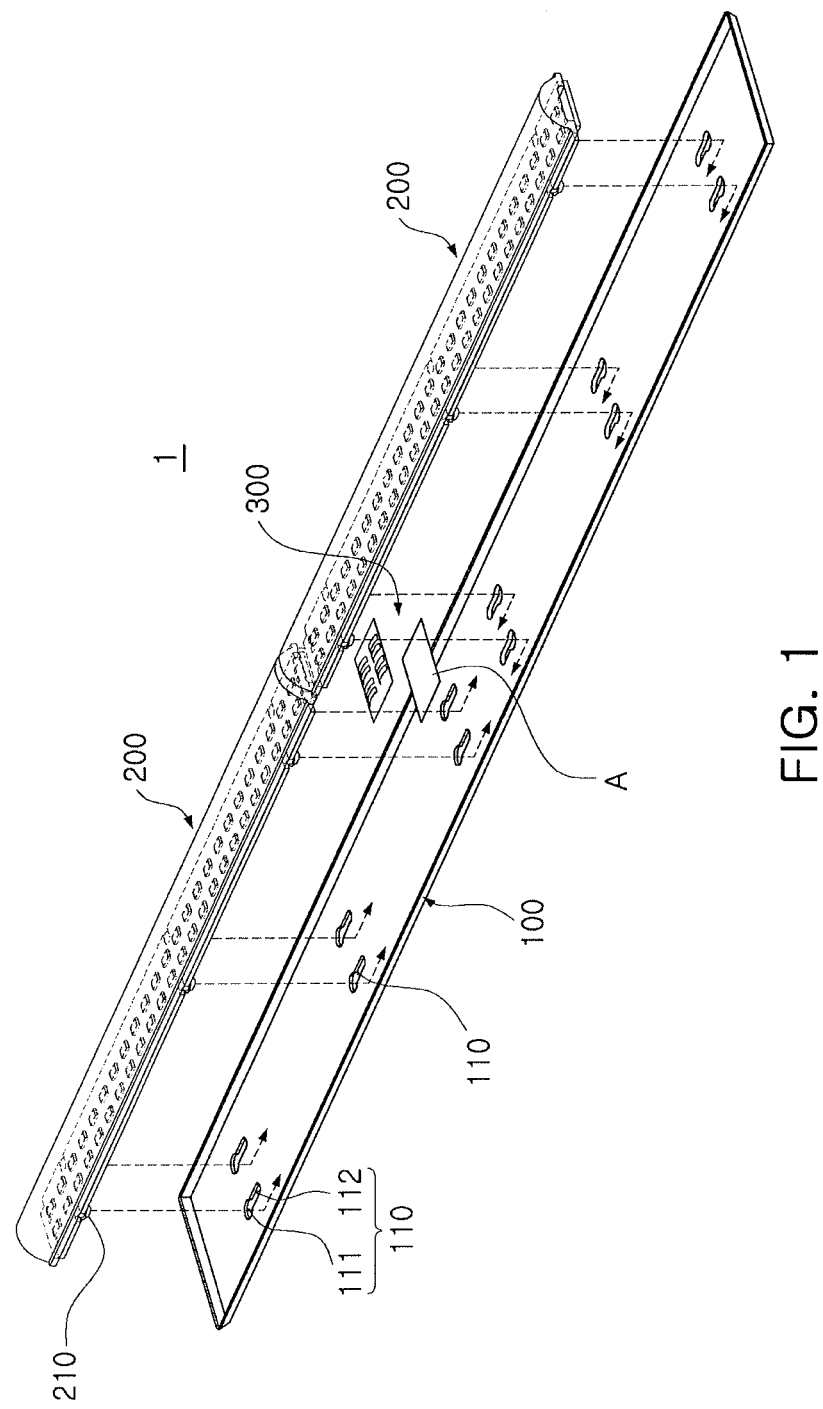
FIG. 1 illustrates a schematic exploded perspective view of a lighting apparatus according to an example embodiment.

With reference to FIG. 1, a lighting apparatus according to an example embodiment is described. FIG. 1 is an exploded perspective view schematically illustrating a lighting apparatus according to an example embodiment.

With reference to FIG. 1, a lighting apparatus 1 according to an example embodiment may include a fixture 100 having a fastening hole 110, a light source module 200 having a fastening pin 210 detachably fastened to the fastening hole 110, and an electrode terminal 300 placed on the fixture 100 and connected to the light source module 200. The light source module 200 may be detachably fixed to the fixture 100 through a structure in which the fastening pin 210 is slidably moved along the fastening hole 110 while the fastening pin 210 is inserted into the fastening hole 110.

Figure 2:
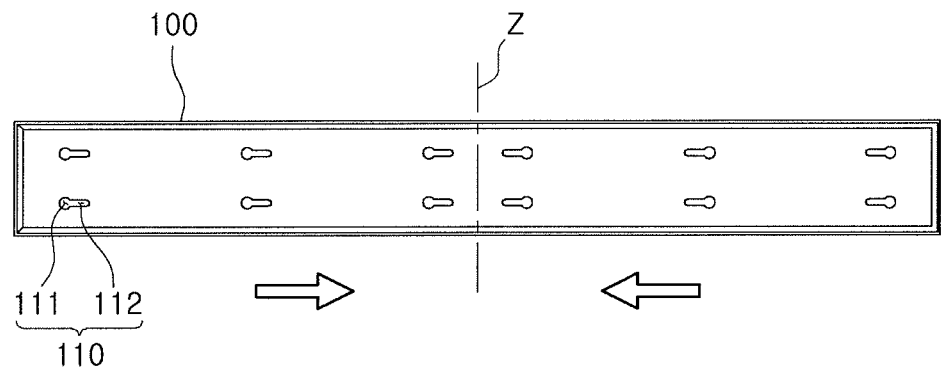
FIG. 2 illustrates a schematic plan view of a fixture in the lighting apparatus in FIG. 1.

FIG. 2 is a plan view schematically illustrating the fixture 100. With reference to FIGS. 1 and 2, the fixture 100 may correspond to a frame, on which the light source module 200 is mounted, and may mechanically fix the light source module 200 and may electrically connect a plurality of the light source module 200.

The fixture 100 may be formed of a solid material to support the light source module 200. In addition, the fixture 100 may be formed of a material allowing heat generated by the light source module 200 to be emitted outwardly. For example, the fixture 100 may be formed of a metallic material, but a material of the fixture 100 is not limited thereto.

A surface of the fixture 100 on which the light source module 200 is mounted may reflect light generated by the light source module 200. The surface may be treated for light reflection to improve light extraction efficiency.

In an example embodiment, the fixture 100 may be exemplified as having an overall rectangular shape, but a shape thereof is not limited thereto. According to design of the lighting apparatus 1, a shape of the fixture 100 may be variously changed to be a polygon, e.g., a triangle, a pentagon, a hexagon, or the like, a circle, or the like.

The fastening hole 110 may be formed as an opening passing through the fixture 100. The fastening hole 110 may be provided as a plurality of fastening holes spaced apart from each other by a predetermined distance.

The fastening hole 110 may include a first portion 111 and a second portion 112, with the second portion 112 having a size smaller than that of the first portion 111 and being connected to the first portion 111. The first portion 111 may have a diameter having a size allowing the fastening pin 210 to be inserted thereinto, e.g., the first portion 111 may have a diameter larger than that of the fastening pin 210. The second portion 112 may have a width smaller than the diameter of the first portion 111, e.g., the second portion 112 may have a width smaller than that of the fastening pin 210. The second portion 112 may extend from the first portion 111 in a direction of a sliding movement of the light source module 200 from the first hole 111, e.g., the second portion 112 may extend from the first portion 111 in a same direction as that of the sliding movement of the light source module 200 from the first hole 111 (see, e.g., arrows in FIG. 2).

The direction of sliding movement of the light source module 200 may be understood to be a direction in which the light source modules 200 are moved toward each other. For example, when two light source modules 200 are mounted on the fixture 100, the direction of sliding movement of the light source modules 200 may be directed toward each other, i.e., towards a center Z of the fixture 100, as illustrated in FIG. 2 (indicated by arrows). In other words, the light source modules 200 disposed on a right side and on a left side of the center Z of the fixture 100 may be slidably moved toward each other, i.e., each one of the light source modules 200 is moved in the direction of the center Z of the fixture 100.

The fastening pin 210 may be inserted into or extracted out from the fastening hole 110 through the first portion 111. The fastening pin 210 may be moved along the second portion 112 while the fastening pin 210 is inserted into the first portion 111.

The light source module 200 may be provided as a plurality of light source modules mounted on the fixture 100. In addition, the light source modules 200 may be electrically connected to each other while the light source modules 200 are mounted on the fixture 100.

In an example embodiment, two light source modules 200 are exemplified as being mounted on the fixture 100 and connected to each other in a longitudinal direction thereof. The number and arrangement of the light source modules 200 are not limited thereto, and may be variously changed.

Figure 3:
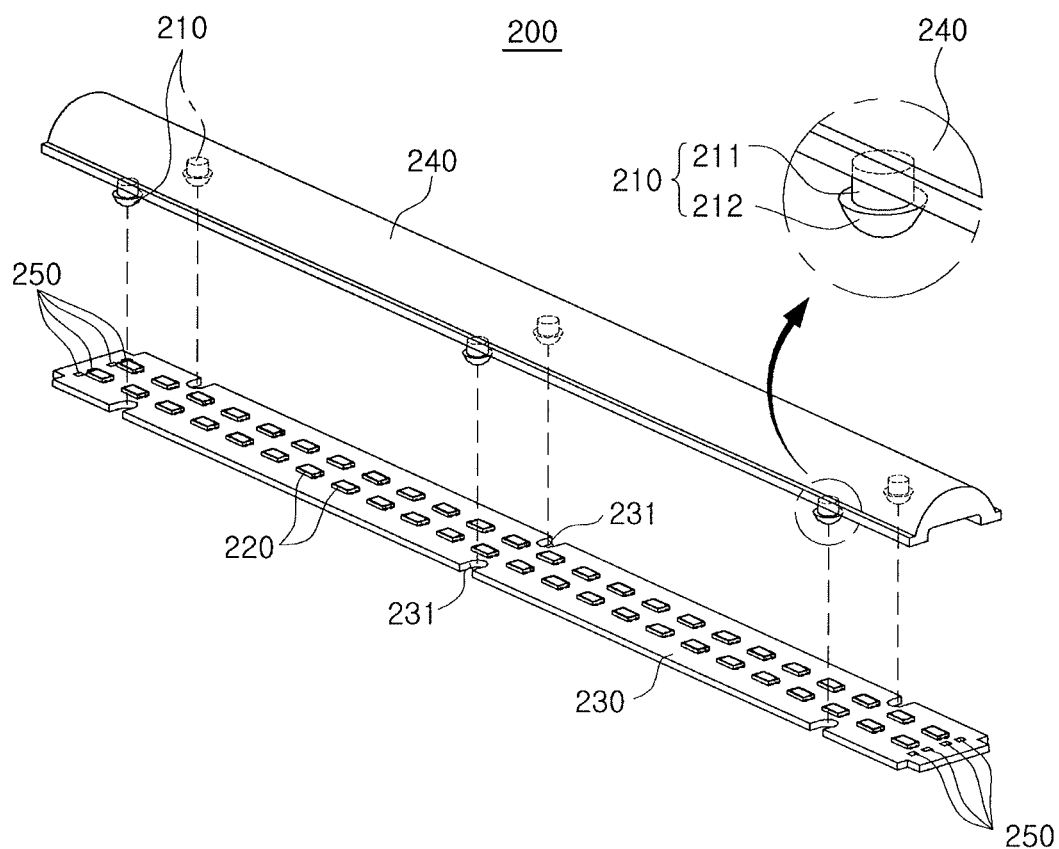
FIG. 3 illustrates a schematic exploded perspective view of a light source module in the lighting apparatus in FIG. 1.

FIG. 3 is an exploded perspective view schematically illustrating the light source module 200 according to an example embodiment. With reference to FIG. 3, the light source module 200 according to an example embodiment may include a plurality of light emitting devices 220, a substrate 230, and an optical element 240.

The light emitting device 220 may be an optoelectronic device generating light having a predetermined wavelength by driving power applied thereto from an external power source. For example, the light emitting device 220 may be a semiconductor light-emitting diode (LED) having an n-type semiconductor layer, a p-type semiconductor layer, and an active layer interposed therebetween. The light emitting device 220 may emit blue light, green light, red light, ultraviolet light, or the like, and may also emit white light according to a combination of a wavelength conversion material such as a phosphor as required.

The light emitting device 220 may be provided as a LED chip having various structures or a LED package on which the LED chip is mounted. In an example embodiment, an LED package is described as being used as a light emitting device, but is not limited thereto.

The plurality of light emitting devices 220 may be mounted on a surface of the substrate 230, e.g., on an upper surface thereof. The plurality of light emitting devices 220 may be arranged in a longitudinal direction of the substrate 230.

In the case of the plurality of light emitting devices 220, the same type of light emitting devices generating light having the same wavelength or different types of light emitting devices generating light having different wavelengths may be provided. In addition, the light emitting devices 220 may be variously configured according to a level of power, e.g., a configuration for 0.5 W and 1 W. In addition, the light emitting devices 220 may be configured of at least two types of light emitting devices having different color temperatures, e.g., 2700 K and 6500 K, to be alternately arranged.

The substrate 230 may be a printed circuit board, e.g., a FR4-type printed circuit board (PCB) or an easily deformable flexible PCB. The printed circuit board may be formed using an organic resin material containing, e.g., epoxy, triazine, silicon, polyimide, and the like, and other organic resin materials, or a ceramic material, e.g., silicon nitride, AlN, $Al_2O_3$, or the like, or a metal and a metal compound, e.g., a metal-core printed circuit board (MCPCB), metal copper clad laminate (MCCL), or the like.

In an example embodiment, the substrate 230 may be exemplified as having a rectangular shape extended to be elongated in a longitudinal direction thereof, but is not limited thereto. The substrate 230 may be deformed, e.g., shaped, to have various shapes according to a shape of the fixture 100.

The substrate 230 may have an insertion groove 231 into which the fastening pin 210 is inserted. The insertion groove 231 may be formed in a position corresponding to the fastening pin 210. In addition, the insertion groove 231 may be provided in a number corresponding to that of the fastening pins 210.

Figure 4:
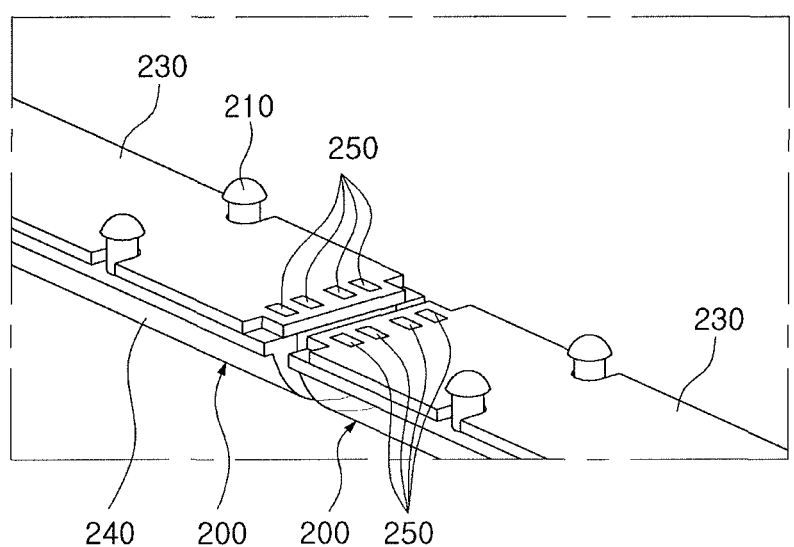
FIG. 4 illustrates a schematic perspective view of the light source module in FIG. 3 as viewed from a direction of a bottom surface.

FIG. 4 schematically illustrates a view of the light source module 200 from a bottom surface thereof.

Figure 11:
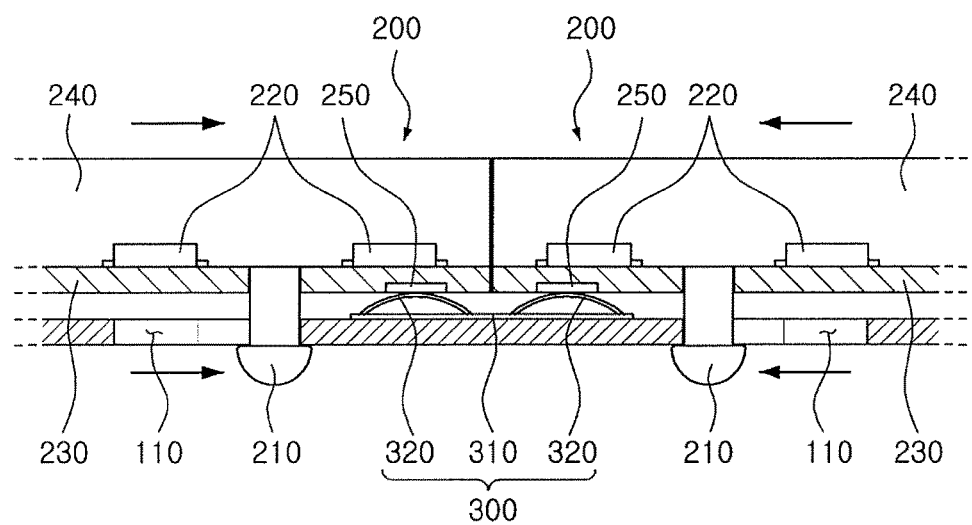
FIG. 11 illustrates a schematic cross-sectional view of light source modules electrically connected to each other.

With reference to FIGS. 3 and 4, electrode pads 250 supplying driving power to the plurality of light emitting devices 220 may be disposed at both, e.g., opposite, ends of the substrate 230. For example, the electrode pads 250 may be mounted on a lower surface of the substrate 230. e.g., on a surface of the substrate 230 facing the fixture 100. In another example, the electrode pads 250 may be exposed externally through the lower surface of the substrate 230 to be level with the lower surface of the substrate 230 (FIG. 11). Electrode pads 250 of one light source module 200 may be connected to electrode pads 250 of another light source module 200 disposed adjacent thereto, or may be connected to an external power source.

The optical element 240 may be disposed on a surface of the substrate 230 to cover the plurality of light emitting devices 220. The optical element 240 may have the fastening pin 210. The fastening pin 210 may be extended toward the substrate 230 from a bottom surface of the optical element 240. The fastening pin 210 may be provided as a plurality of fastening pins disposed to be spaced apart from each other at regular intervals in a longitudinal direction of the optical element 240.

The optical element 240 may be detachably fastened to the substrate 230 through the fastening pin 210. For example, the optical element 240 may be fastened to or separated from the substrate 230, as the fastening pin 210 is inserted into or extracted from the insertion groove 231 of the substrate 230.

The fastening pin 210 may include a rod 211 extended from the optical element 240 and a stop protrusion 212 radially protruding from an end of the rod 211.

The rod 211 may have a length longer than a total thickness of the substrate 230 and the fixture 100. In detail, the rod 211 may protrude downwardly from a bottom surface of the fixture 100 to pass through the insertion groove 231 of the substrate 230 and through the fastening hole 110 of the fixture 100. In addition, when the rod 211 of the fastening pin 210 extends through the substrate 230 and the fixture 100, the stop protrusion 212 of the fastening pin 210 may be disposed on the bottom surface of the fixture 100 to be exposed externally, as will be described in more detail with reference to FIG. 5A.

In detail, the rod 211 may have a diameter smaller than a diameter of the first portion 111 of the fastening hole 110, smaller than a width of the second portion 112 of the fastening hole 110, and smaller than a diameter of the insertion groove 321. Thus, the rod 211 may pass through the insertion groove 321, as well as through both the first portion 111 and the second portion 112 of the fastening hole 110.

The stop protrusion 212 may have a diameter smaller than the diameter of the first portion 111 and the insertion groove 321, but may have a diameter greater than the width of the second portion 112 of the fastening hole 110. Thus, the stop protrusion 212 may pass through the insertion groove 321 and through the first portion 111, but may not pass through the second portion 112, as illustrated in FIGS. 5A-5B.

Figure 5A:
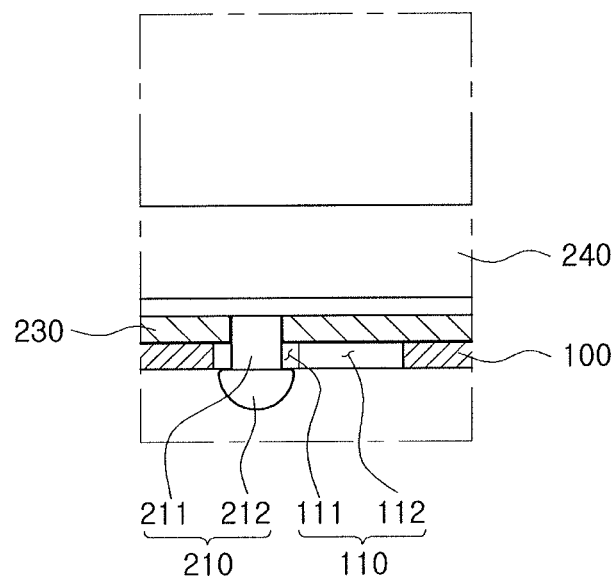
FIGS. 5A and 5B illustrate schematic cross-sectional view and bottom view, respectively, of a fastening pin inserted into a first portion of a fastening hole.
Figure 5B:
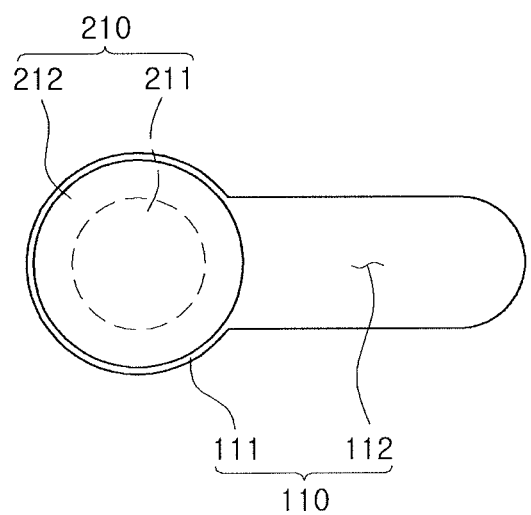

FIGS. 5A and 5B are a cross-sectional view and a bottom view schematically illustrating the fastening pin 210 inserted into the first portion 111 of the fastening hole 110. Referring to FIGS. 5A-5B, the fastening pin 210 passes through the substrate 230 and through the first portion 111 of the fastening hole 110, i.e., both the rod 211 and the stop protrusion 212 of the fastening pin 210 pass through the substrate 230 and through the first portion 111 of the fastening hole 110 to position the stop protrusion 212 externally with respect to the fixture 100 and the substrate 230.

Figure 6A:
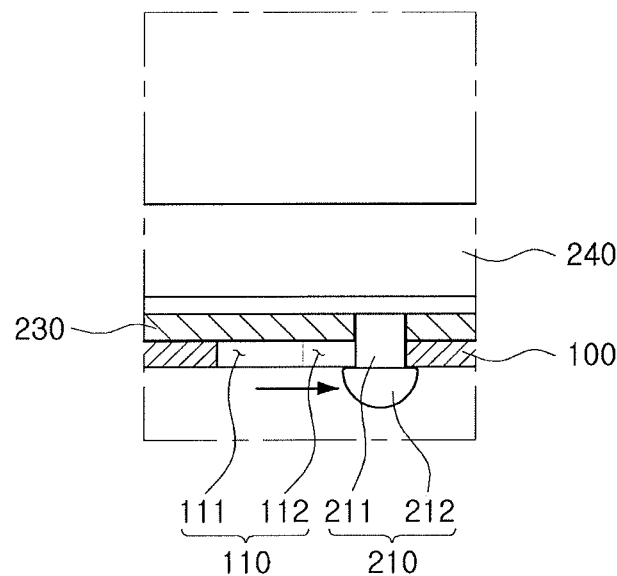
FIGS. 6A and 6B illustrate schematic cross-sectional view and bottom view, respectively, of a fastening pin moved from a first portion to a second portion.
Figure 6B:
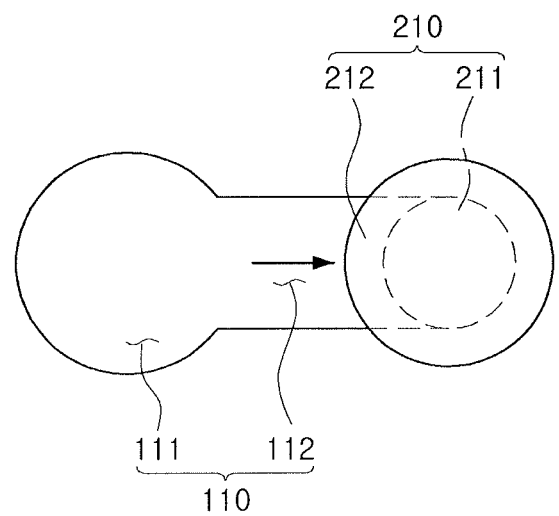

FIGS. 6A and 6B are a cross-sectional view and a bottom view schematically illustrating the fastening pin 210 after moving from the first portion 111 to the second portion 112 of the fastening hole 110. Referring to FIGS. 6A and 6B, after the fastening pin 210 passes through the first portion 111 to allow the stop protrusion 212 to be exposed externally from the bottom surface of the fixture 100 (FIGS. 5A-5B), the fastening pin 210 is moved, i.e., the rod 211 of the fastening pin 210 slides, from the first portion 111 of the fastening hole 110 to the second portion 112. As the stop protrusion is bigger than the second portion 112 of the fastening hole 110, the stop protrusion 212 is caught by the bottom surface of the fixture 100 in the second portion 112. Thus, the fastening pin 210 may not be extracted from the fixture 100 to be caught and fixed in a position of the second portion 112. As such, the fastening pin 210 is secured in the second portion 112 of the fastening hole 110 via the stop protrusion 212, thereby securing the optical element 240 to the fixture 100.

As described above, the substrate 230, on which the plurality of light emitting devices 220 are mounted, is fastened to the optical element 240 having the fastening pin 210. In addition, while the fastening pin 210 is inserted into the fastening hole 110 of the fixture 100, the substrate 230 together with the optical element 240 are slidably moved on a surface of the fixture 100 along, e.g., within, the fastening hole 110 via the rod 211 of the fastening pin 210 to allow the light source module 200 to be easily fixed to the fixture 100 or to be separated from the fixture 100.

The light source module 200 according to an example embodiment may allow for mechanical fixing with the fixture 100, and for an electrical connection to be formed with an adjacent light source module 200 simultaneously through sliding movement. An electrical connection between the light source modules 200 may be performed through the electrode terminal 300.

Referring to FIG. 1, the electrode terminal 300 may be attached to the fixture 100 to allow the light source modules 200 to be electrically connected to each other. The electrode terminal 300 may be disposed on a surface of the fixture 100.

In detail, the electrode terminal 300 may be disposed at a position at which a pair of light source modules 200 contact each other, e.g., at a position at which a first light source module 200 and a second light source module 200 are in contact with each other. In addition, the electrode terminal 300 may be connected to a surface of the substrate 230 of each light source module 200, e.g., the electrode terminal 300 may be connected to the lower surface of the substrate 230 to contact the electrode pads 250.

Figure 7:
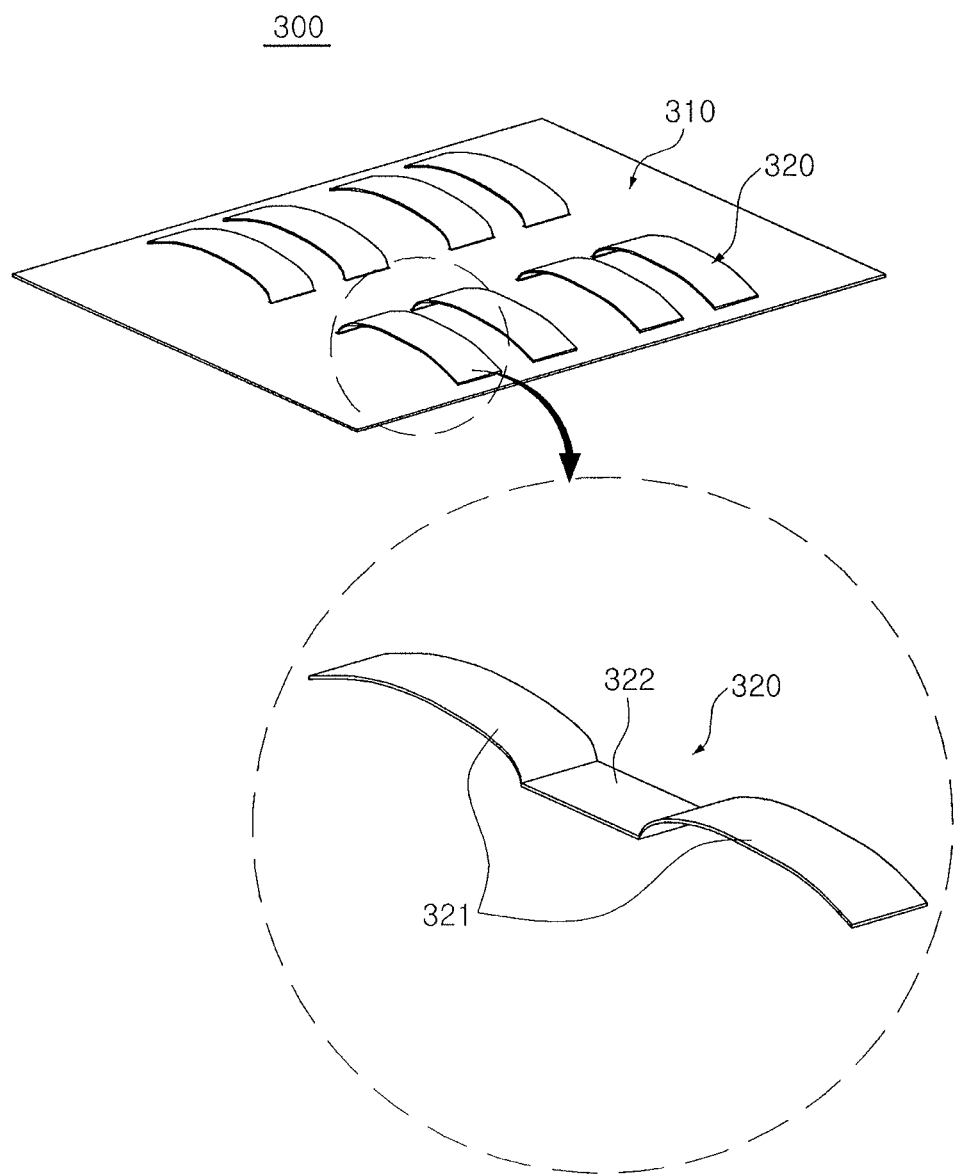
FIG. 7 illustrates a schematic perspective view of an electrode terminal in the lighting apparatus in FIG. 1.

FIG. 7 schematically illustrates the electrode terminal 300 according to an example embodiment. With reference to FIG. 7, the electrode terminal 300 may include a body portion 310 detachably connected to the fixture 100, and a terminal portion 320 partially exposed from the body portion 310.

In detail, the body portion 310 may be formed of an insulating material, e.g., a thermosetting resin. For example, as illustrated in FIG. 1, the body portion 310 may be detachably connected to the fixture 100 using an adhesive portion A, e.g., a double-sided tape, Velcro, or the like.

The terminal portion 320 is partially exposed from the body portion 310 to be electrically connected to the electrode pad 250 of the substrate 230. As illustrated in the enlarged circled portion of FIG. 7, the terminal portion 320 may include a pair of contact parts 321 protruding upwardly from the body portion 310 to be exposed and having a structure in the form of a plate spring, and a connection part 322 connecting the pair of contact parts 321. For example, the connection part 322 may be within, e.g., internal to, the body portion 310 of the electrode terminal 300, and the pair of contact parts 321, connected to opposite ends of the body portion 310, may extend out of the body portion 310 to be external to the body portion 310. That is, only the contact parts 321 among the contact parts 321 and the connection part 322 are visible when looking at a top surface of the electrode terminal 300 in FIG. 7.

The terminal portion 320 may have a structure being extended while the pair of contact parts 321 and the connection part 322 form a straight line. In other words, as illustrated in FIG. 7, the connection part 322 with the pair of contact parts 321 may be aligned along a same imaginary line. For example, the terminal portion 320 may be formed of a metallic material, e.g., aluminum (Al), copper (Cu), or the like.

Figure 8:
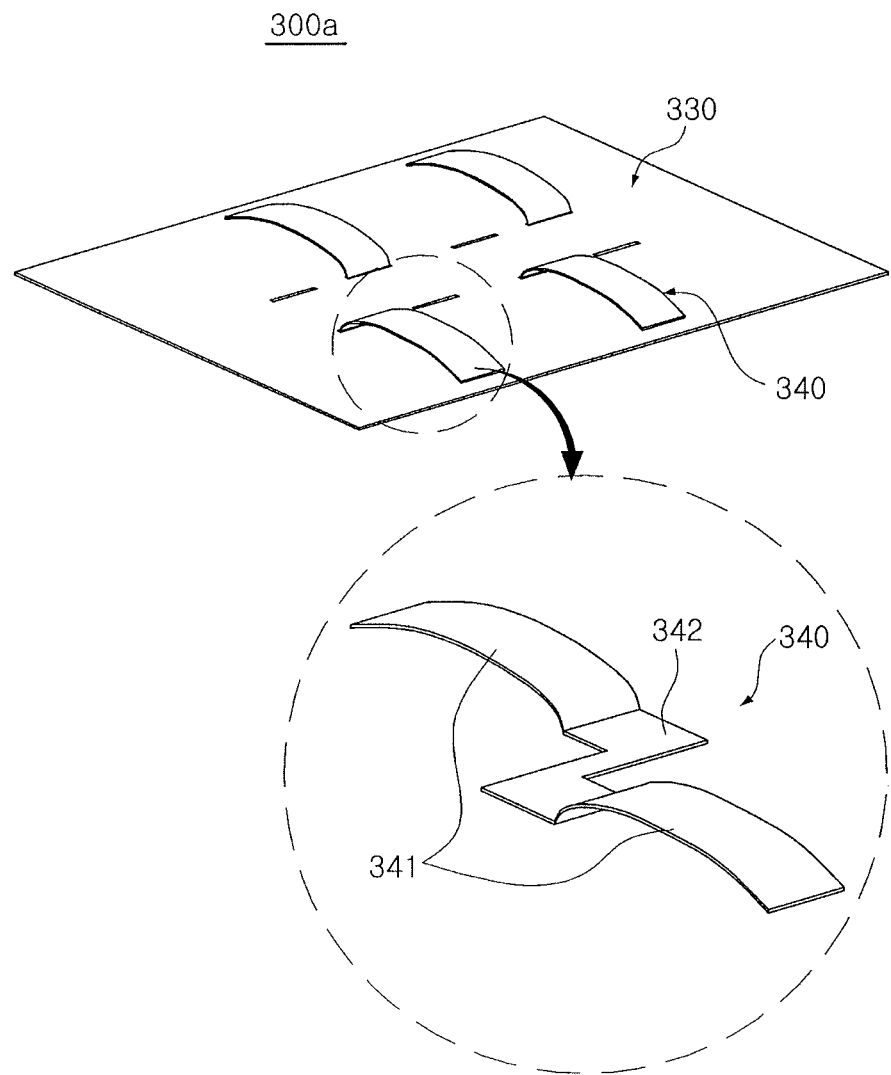
FIG. 8 illustrates a schematic perspective view of a modified example of an electrode terminal.

FIG. 8 schematically illustrates a modified example of an electrode terminal 300a. With reference to FIG. 8, the electrode terminal 300a may include a body portion 330 detachably connected to the fixture 100, and a terminal portion 340 partially exposed from the body portion 330.

The body portion 330 may be formed of an insulating material. In addition, the body portion 330 may be detachably connected to the fixture 100 using the adhesive portion A.

The terminal portion 340 may include a pair of contact parts 341 protruding upwardly from the body portion 330 and having a structure in the form of a plate spring, and a connection part 342 connecting the pair of contact parts 341. The terminal portion 340 may have a structure in which the pair of contact parts 341 is offset and connected to the connection part 342 in a zigzag shape. In other words, while the terminal portion 320 in FIG. 7 may have a structure being extended in a straight line to allow the pair of contact parts 321 to be located on the same straight line, the terminal portion 340 in FIG. 8 may have a structure in which the pair of contact parts 341 is located on two straight lines in parallel with each other.

As described above, the electrode terminals 300 and 300a in contact with the electrode pad 250 of the substrate 230 allow the pair of light source modules 200 to be electrically connected to each other. Further, the electrode terminals 300 and 300a allow the light source modules 200 to be electrically connected to each other in series or in parallel through the terminal portions 320 and 340 having different structures.

The light source module 200 according to an example embodiment may be mechanically fixed to the fixture 100 and electrically connected to a different light source module 200 simultaneously through a sliding-movement. The process of fastening two light source modules 200 to the fixture 100 will be described below with reference to FIGS. 9-10.

Figure 9:
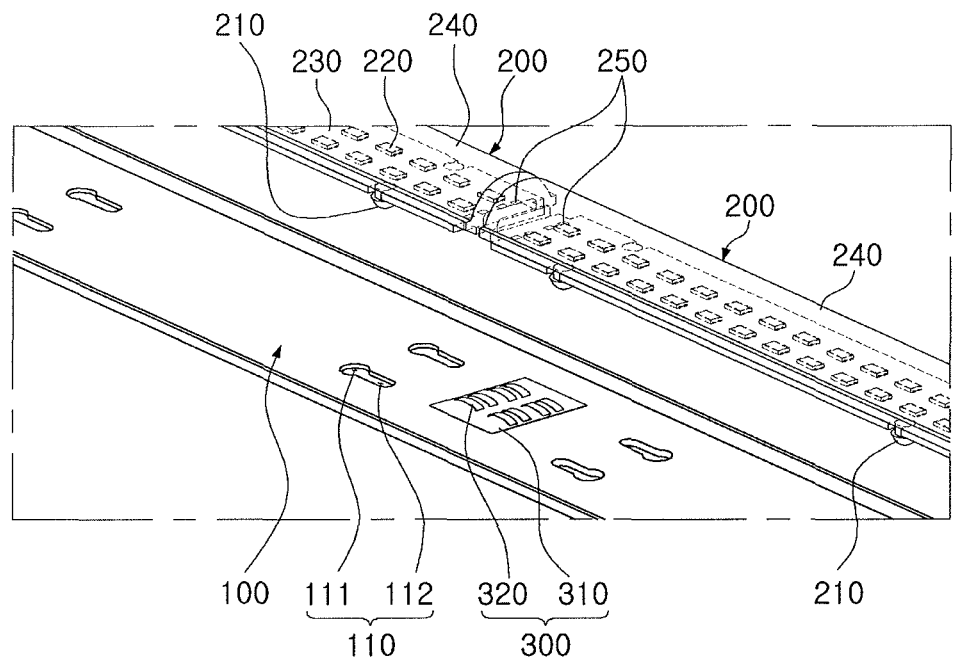
FIGS. 9 to 10 illustrate schematic perspective views of stages in a process of fastening light source modules to a fixture.

Referring to FIG. 9, two light source modules 200 may be initially disposed above the fixture 100 in a manner in which the two light source modules 200 oppose each other, e.g., two facing ends of the two light source modules 200 may be adjacent to each other. The two light source modules 200 may be disposed at a position in which the fastening pin 210 of each light source module 200 opposes, e.g., faces, the fastening hole 110 of the fixture 100.

The electrode terminal 300 may be disposed to be attached to a, e.g., central, region of the fixture 100. For example, the electrode terminal 300 may be disposed to be located in a position corresponding to a gap between the two light source modules 200 when the two light source modules 200 are fixed to the fixture 100.

Figure 10:
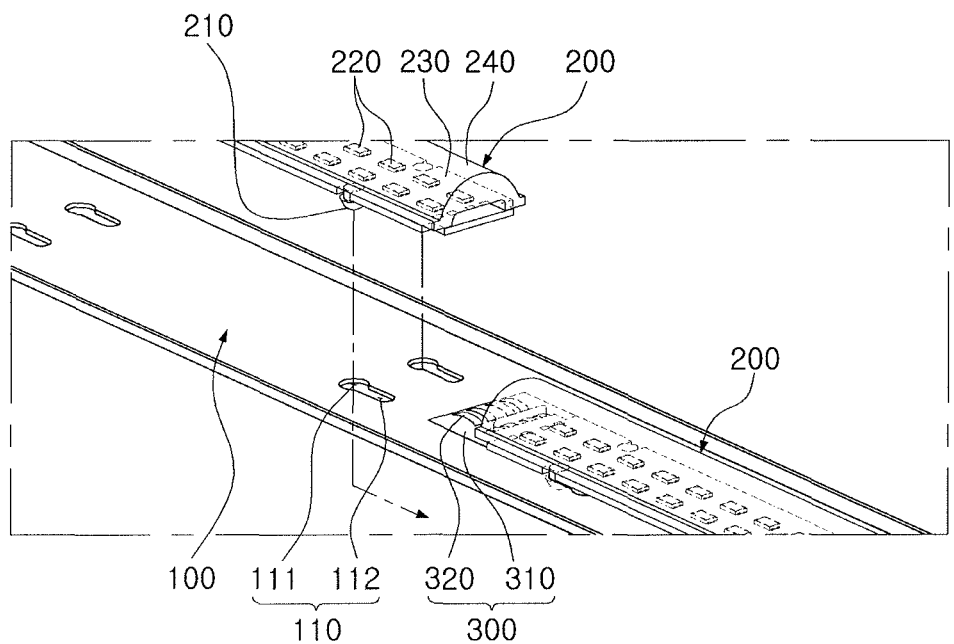

Next, as illustrated in FIG. 10, one light source module 200 of the two light source modules 200 may be fixed to the fixture 100 through a sliding movement in advance of the other light source module 200, followed by fixing the other light source module 200 to the fixture 100 through a sliding movement. Alternatively, the two light source modules 200 may be fixed to the fixture 100 simultaneously through simultaneous sliding movements thereof. As further illustrated in FIG. 10, when the light source module 200 slides along the fixture 100, i.e., for the fastening pin 210 to slide into the second part 112 of the fastening hole 110, the electrode pads 250 on the lower surface of the substrate 230 are aligned with and contact the terminal portions 320 of the electrode terminal 300.

FIG. 11 schematically illustrates the connection of the electrode pads 250 of the light source modules 200 to the electrode terminal 300.

As discussed previously, and as illustrated in FIG. 11, when the two light source modules 200 are slidably moved to be fixed to the fixture 100, the electrode pads 250 exposed at the lower surface of the substrate 230 of each light source module 200 may be in contact with respective terminal portions 320 of the electrode terminal 300. As further illustrated in FIG. 11, the terminal portions 320 protrude upwardly from the body portion 310 of the electrode terminal 300 to contact the electrode pads 250. Thus, the two light source modules 200 may be electrically connected to each other through the electrode terminal 300.

In other words, the two light source modules 200 may be electrically connected to each other and mechanically fixed to the fixture 100 simultaneously, through sliding movements thereof. Therefore, as described above, through a single process, i.e., through the sliding movement, the light source modules 200 may be simultaneously both fixed to the fixture 100 and electrically connected to each other. As such, the entire manufacturing process may be simplified, and the manufacturing time may be reduced. In addition, a separate cabling process for connecting the light source modules 200 to each other, e.g., as compared to related art, may be omitted, thereby reducing manufacturing costs and time.

In addition, as the light source module 200 according to an example embodiment has a structure in which the substrate 230, on which the plurality of light emitting devices 220 are mounted, is detachably fastened to the optical element 240, which has the fastening pin 210 for fixing the light source module 200, even when a problem occurs in a portion of the light emitting device 220, the substrate 230 may be separated from the optical element 240 to be replaced with a different substrate 230 to be fastened thereto, thereby being easily maintained. In addition, an entire light source module 200 does not need to be replaced, thereby reducing maintenance costs.

Figure 12:
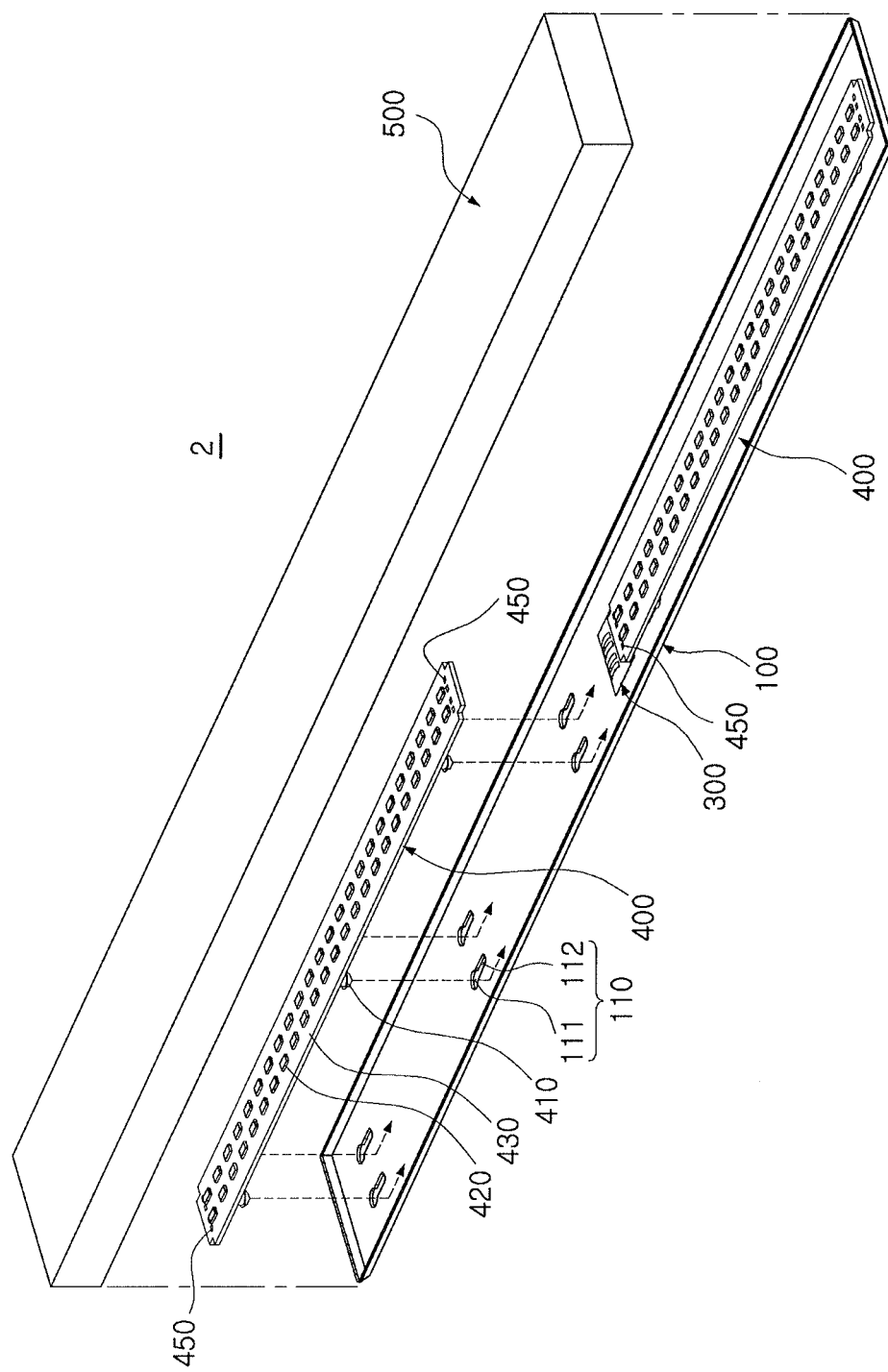
FIG. 12 illustrates a schematic exploded perspective view of a lighting apparatus according to an example embodiment.
Figure 13:
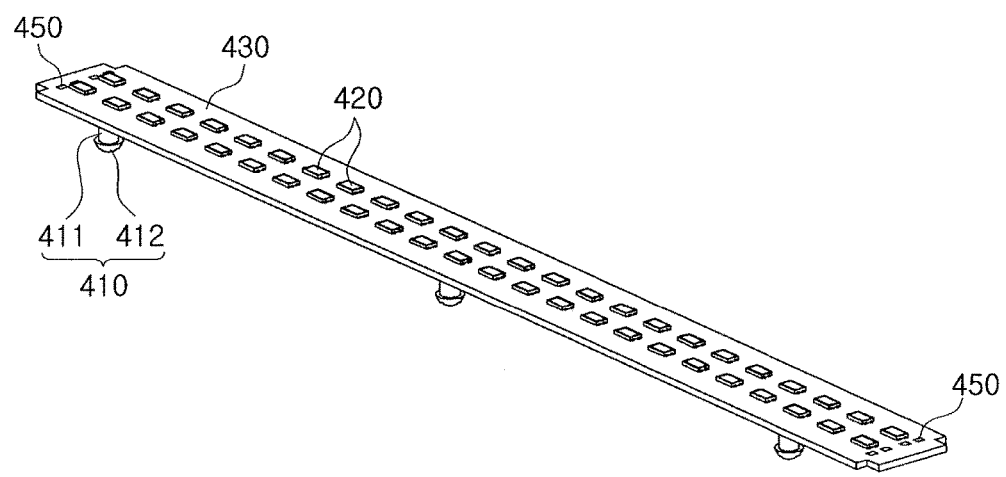
FIG. 13 illustrates a schematic perspective view of a light source module in the lighting apparatus in FIG. 12.

FIGS. 12 and 13 illustrate a lighting apparatus according to an example embodiment. FIG. 12 is an exploded perspective view schematically illustrating a lighting apparatus according to an example embodiment, and FIG. 13 is a perspective view schematically illustrating a light source module in the lighting apparatus in FIG. 12.

With reference to FIGS. 12 and 13, a lighting apparatus 2 according to an example embodiment may include the fixture 100 having the fastening hole 110, the electrode terminal 300 placed on the fixture 100, light source modules 400 having fastening pins 410 detachably fastened to the fastening holes 110, respectively, and a cover 500.

The light source module 400 may be detachably fixed to the fixture 100 through a structure in which the fastening pin 410 is slidably moved along, e.g., within, the fastening hole 110 while the fastening pin 410 is inserted into the fastening hole 110, and may be electrically connected to a different light source module 400 through the electrode terminal 300. A configuration of the lighting apparatus 2 in FIGS. 12 and 13 may be substantially the same as that of the lighting apparatus 1 described previously with reference to FIGS. 1-11, with the exception of the structure of the light source module 400. Thus, hereinafter, detailed descriptions of contents described previously will be omitted and additional features will be mainly described.

The fixture 100 may have the fastening hole 110 for fastening with the light source module 400. The fastening hole 110 may be formed as an opening passing through the fixture 100. The fastening hole 110 may include the first portion 111 into which the fastening pin 410 is inserted, and the second portion 112 having a width smaller than a diameter of the first portion 111 and connected to the first portion 111 to be extended in a direction of a sliding movement of the light source module 400.

The electrode terminal 300 may be detachably connected to the fixture 100 to allow the light source modules 400 to be electrically connected to each other. The electrode terminal 300 may be disposed between the pair of light source modules 400 on a surface of the fixture 100. In addition, the electrode terminal 300 may be electrically connected to the pair of the light source modules 400 disposed to the right and to the left, respectively. The electrode terminal 300 may include the body portion 310 detachably connected to the fixture 100, and the terminal portion 320 partially exposed from the body portion 310.

The light source modules 400 may be provided as a plurality of light source modules mounted on the fixture 100. In addition, the light source modules 400 may be electrically connected to each other by the electrode terminal 300 while the light source modules 400 are mounted on the fixture 100. The light source module 400 may include a plurality of light emitting devices 420 and a substrate 430.

The light emitting device 420 may be provided as a light-emitting diode (LED) chip having various structures or a LED package on which a LED chip is mounted. In an example embodiment, the LED package is described to be used as the light emitting device 420. The plurality of light emitting devices 420 may be mounted on a surface of the substrate 430, e.g., on an upper surface thereof. The plurality of light emitting devices 420 may be arranged in a longitudinal direction of the substrate 430.

In an example embodiment, the substrate 430 is exemplified as having a rectangular shape extended to be elongated in a longitudinal direction thereof, but is not limited thereto. The substrate 430 may have various shapes, according to a shape of the fixture 100.

Electrode pads 450 supplying driving power to the plurality of light emitting devices 420 mounted on the upper surface of the substrate 430 may be disposed on both ends of the substrate 430, respectively. The electrode pad 450 may be exposed externally through a surface of the substrate 430. The electrode pads 450 may be connected to electrode pads 450 of a different light source module 400 disposed adjacent thereto, or may be connected to an external power source.

The substrate 430 may have the fastening pin 410 detachably fastened to the fastening hole 110. The fastening pin 410 may protrude in a direction opposite to the plurality of light emitting devices 420 in the other surface of the substrate 430, for example, in a bottom surface thereof, to be extended.

The fastening pin 410 may be provided as a plurality of fastening pins disposed to be spaced apart from each other at regular intervals in a longitudinal direction of the substrate 430. The fastening pin 410 may include a rod 411 extended from the substrate 430 and a stop protrusion 412 radially protruding from an end of the rod 411.

The rod 411 may have a length longer than a thickness of the fixture 100. In detail, the rod 411 may protrude downwardly from a bottom surface of the fixture 100 while the rod passes through the fixture 100. In addition, the stop protrusion 412 may be disposed on the bottom surface of the fixture 100 to be exposed externally.

The rod 411 may have a diameter smaller than the diameter of the first portion 111 and the width of the second portion 112. Thus, the rod 411 may pass through both the first portion 111 and the second portion 112.

The stop protrusion 412 may have a diameter smaller than the first portion 111, and may have the diameter greater than the second portion 112. Thus, the stop protrusion 412 may pass through the first portion 111, but may not pass through the second portion 112.

The light source module 400 according to present example embodiment is different from the light source module 200 described previously with reference to FIGS. 1-11, in that the fastening pin 410 fastened to the fastening hole 110 of the fixture 100 is provided in the substrate 430. In other words, while the light source module 200 according to an example embodiment illustrated in FIGS. 1 to 11 includes the fastening pin 210 in the optical element 240, the light source module 400 does not have an optical element and, therefore, includes the fastening pin 410 in the substrate 430.

As described above, while the fastening pin 410 of the substrate 430 is inserted into the fastening hole 110 of the fixture 100, the substrate 430 is slidably moved on a surface of the fixture 100 along the fastening hole 110 to allow the light source module 400 to be easily fixed to the fixture 100 or to be separated from the fixture 100. In addition, an electrical connection between the light source modules 400 may be implemented by fixing the light source module 400 to the fixture 100. In other words, mechanical fixing and an electrical connection of the light source modules 400 may be performed simultaneously. Thus, while a light source module is fixed, a separate process, e.g., an additional cabling process, allowing light source modules to be electrically connected thereto may be omitted.

The cover 500 may be mounted on the fixture 100 to cover the light source modules 400. The cover 500 may cover the light source modules 400 to be protected from an external environment, and may diffuse light generated by each light source module 400 externally. The cover 500 may be formed of a resin material having light transmission properties, e.g., polycarbonate (PC), polymethylmethacrylate (PMMA), acryl, and the like.

The cover 500 may have a surface in which a concave-convex structure is formed through surface treatment. Thus, light emitted externally may be diffused more widely and more uniformly therethrough.

Figure 14:
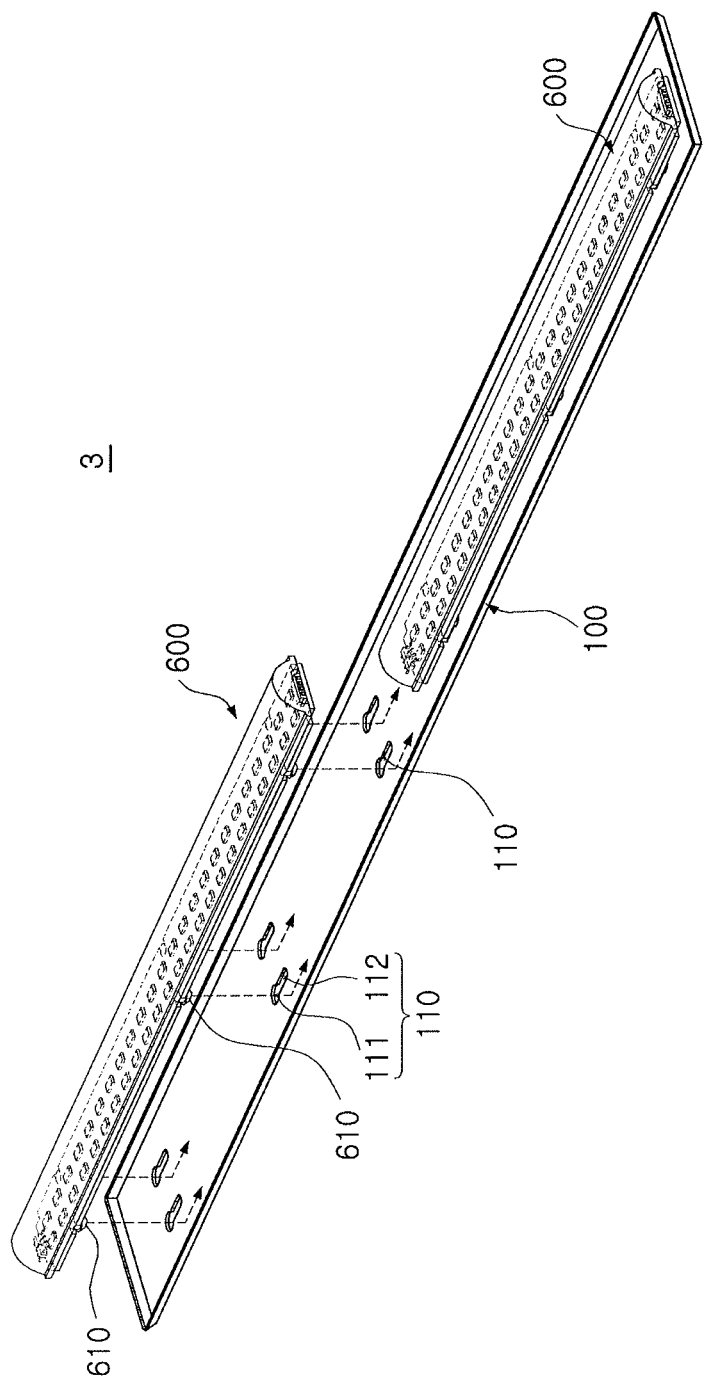
FIG. 14 illustrates a schematic exploded perspective view of a lighting apparatus according to an example embodiment.

FIG. 14 illustrates a schematic exploded perspective view of a lighting apparatus according to an example embodiment.

With reference to FIG. 14, a lighting apparatus 3 according to an example embodiment may include the fixture 100 having the fastening hole 110, and a light source module 600 having a fastening pin 610 detachably fastened to the fastening hole 110. The light source module 600 may be detachably fixed to the fixture 100 through a structure in which the fastening pin 610 is slidably moved along, e.g., within, the fastening hole 110 while the fastening pin 610 is inserted into the fastening hole 110.

A configuration of the lighting apparatus 3 according to an example embodiment illustrated in FIG. 14 may be substantially the same as that of the lighting apparatus 1 described previously with reference to FIGS. 1-11, with the exception of the electrical connection structure of the light source modules. Thus, hereinafter, detailed descriptions of contents described previously will be omitted and additional features will be mainly described.

The fixture 100 may have the fastening hole 110 for allowing the light source module 600 to be fastened. The fastening hole 110 may be formed as an opening passing through the fixture 100. The fastening hole 110 may include the first portion 111 into which the fastening pin 610 is inserted, and the second portion 112 having a width smaller than a diameter of the first portion 111, and connected to the first portion 111 to be extended in a direction of a sliding movement of the light source module 600.

The light source module 600 may be provided as a plurality of light source modules mounted on the fixture 100. In addition, the light source modules 600 may be electrically connected to each other while the light source modules are mounted on the fixture 100.

In an example embodiment, two light source modules 600 are exemplified as being mounted on the fixture 100, and being connected to each other in a longitudinal direction of the fixture 100, but are not limited thereto. The number and arrangement of the light source modules 600 may be variously changed. The structure of the light source module 600 will be described in more detail below with reference to FIG. 15.

Figure 15:
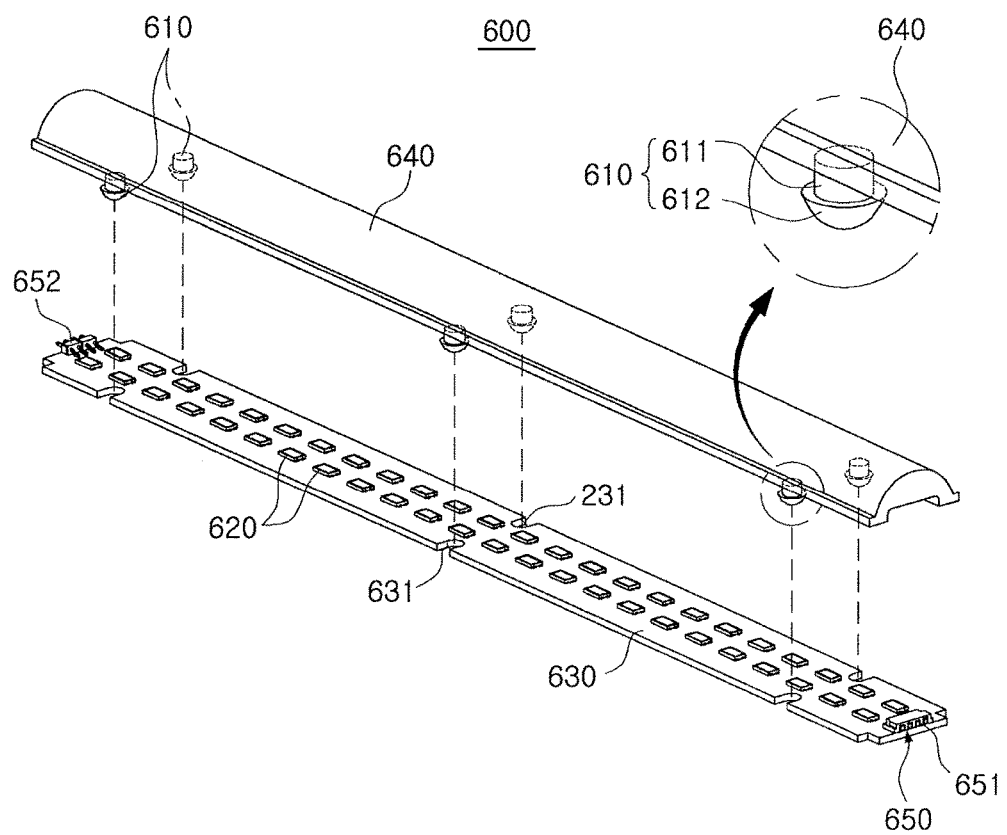
FIG. 15 illustrates a schematic exploded perspective view of a light source module in the lighting apparatus in FIG. 14.

FIG. 15 is an exploded perspective view schematically illustrating the light source module 600. With reference to FIG. 15, the light source module 600 may include a plurality of light emitting devices 620, a substrate 630, and an optical element 640.

The light emitting device 620 may be provided as a LED chip having various structures and/or a LED package on which a LED chip is mounted. The plurality of light emitting devices 620 may be mounted on a surface of the substrate 630, e.g., on an upper surface thereof. The plurality of light emitting devices 620 may be arranged in a longitudinal direction of the substrate 630.

The substrate 630 may be a printed circuit board, e.g., may be a FR4-type printed circuit board (PCB) or an easily deformable flexible PCB. The printed circuit board may be formed using an organic resin material containing, e.g., epoxy, triazine, silicon, polyimide, and the like, and other organic resin materials, or a ceramic material, e.g., silicon nitride, AlN, $Al_2O_3$, or the like, or a metal and a metal compound, e.g., a metal-core printed circuit board (MCPCB), metal copper clad laminate (MCCL), or the like.

In an example embodiment, the substrate 630 may be exemplified as having a rectangular shape extended to be elongated in a longitudinal direction thereof, but is not limited thereto. The substrate 630 may be deformed, e.g., shaped, to have various shapes, according to a shape of the fixture 100.

The substrate 630 may have an insertion groove 631 into which the fastening pin 610 is inserted. The insertion groove 631 may be formed in a position corresponding to the fastening pin 610. In addition, the insertion groove 631 may be provided in a number corresponding to that of the fastening pin 610.

A connector 650 supplying driving power to the plurality of light emitting devices 620 may be disposed on both ends of the substrate 630, respectively. The connector 650 may include a female connector 651 and a male connector 652. The connector 650 may be connected to a connector 650 of a different light source module 600 or may be connected to an external power source.

The optical element 640 may be disposed on a surface of the substrate 630 to cover the plurality of light emitting devices 620. The optical element 640 may have the fastening pin 610. The fastening pin 610 may be extended toward the substrate 630 from a bottom surface of the optical element 640. The fastening pin 610 may be provided as a plurality of fastening pins disposed to be spaced apart from each other at regular intervals in a longitudinal direction of the optical element 640.

The optical element 640 may be detachably fastened to the substrate 630 through the fastening pin 610. In detail, the optical element 640 may be fastened to or separated from the substrate 630, as the fastening pin 610 is inserted into or extracted from the insertion groove 631 of the substrate 630. The fastening pin 610 may include a rod 611 extended from the optical element 640, and a stop protrusion 612 radially protruding from an end of the rod 611.

The rod 611 may have a length longer than a total thickness of the substrate 630 and the fixture 100. In detail, the rod 611 may protrude downwardly from a bottom surface of the fixture 100 while the rod passes through the substrate 630 and the fixture 100. In addition, the stop protrusion 612 is disposed on the bottom surface of the fixture 100 to be exposed externally.

The rod 611 may have a diameter smaller than the diameter of the first portion 111 and the width the second portion 112. Thus, the rod 611 may pass through both the first portion 111 and the second portion 112.

The stop protrusion 612 may have a diameter smaller than the diameter of the first portion 111, and may have the diameter greater than the width of the second portion 112. Thus, the stop protrusion 612 may pass through the first portion 111, but may not pass through the second portion 112.

The light source module 600 according to an example embodiment may allow simultaneously for mechanical fixing with the fixture 100, and for an electrical connection with a different light source module 600, through sliding movements thereof. The sliding movement of the light source module 600 on the fixture 100 will be described in more detail below with reference to FIGS. 16A-16C.

Figure 16A:
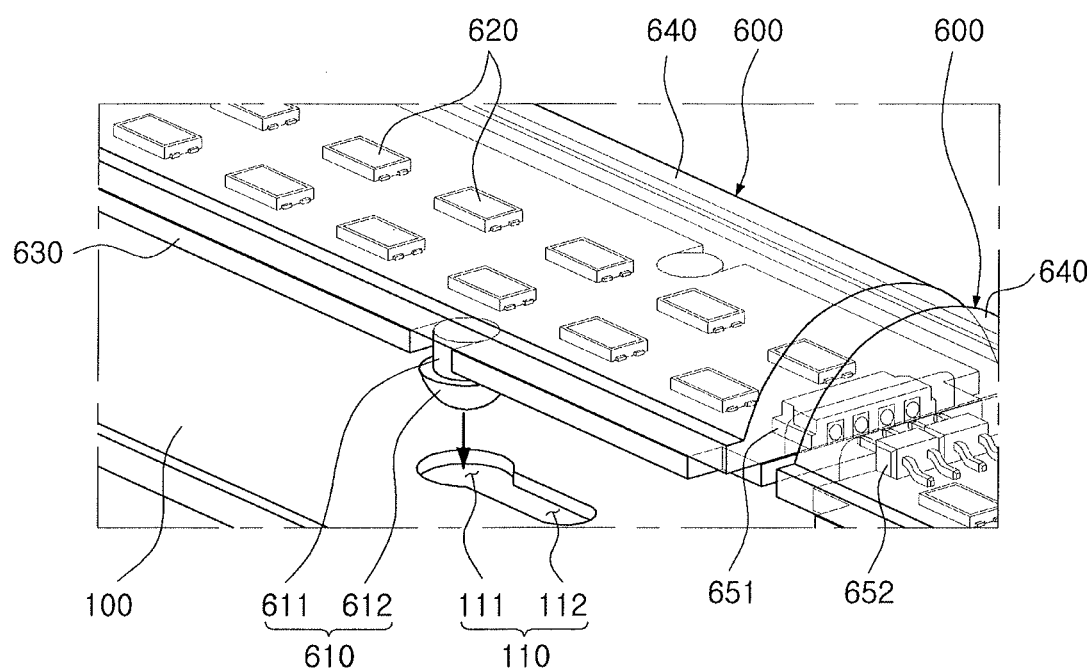
FIGS. 16A to 16C illustrate schematic perspective views of stages in a process of fastening light source modules to a fixture and electrically connecting to each other.

Referring to FIG. 16A, when two light source modules 600 are mounted as illustrated in FIG. 14, the two light source modules 600 may be initially disposed above the fixture 100 with a structure in which the two light source modules 600 oppose each other, e.g., two facing ends thereof may be adjacent to each other. The two light source modules 600 may be disposed in a position in which the fastening pin 610 of each light source module 600 opposes, e.g., is aligned with, the fastening hole 110 of the fixture 100.

Figure 16B:
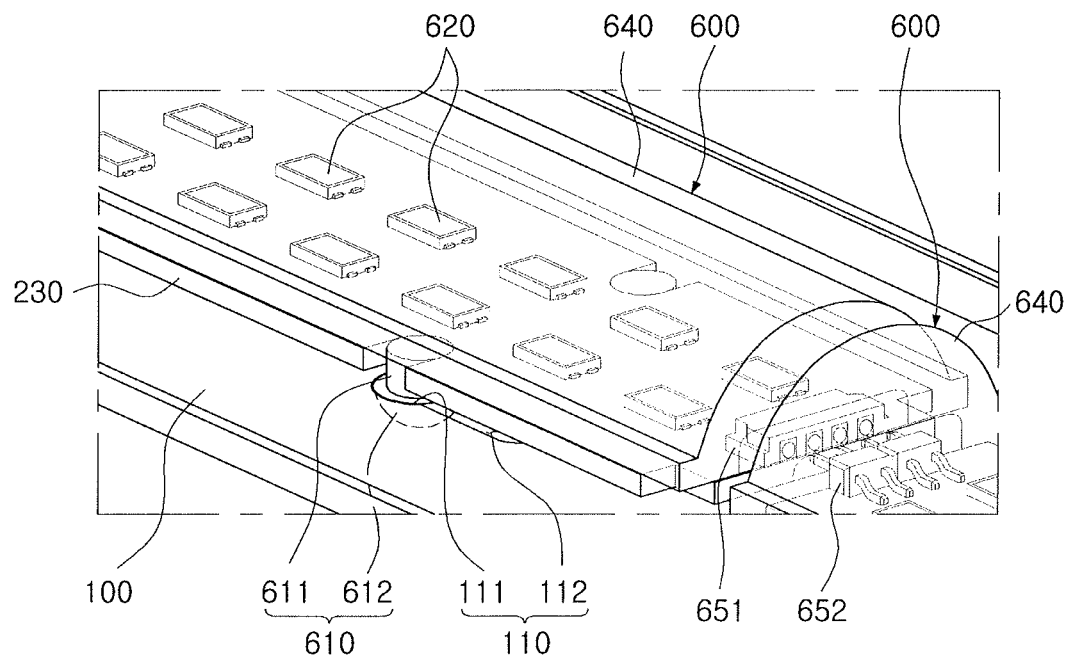

As illustrated in FIG. 16B, the two light source modules 600 may be placed on the fixture 100 to allow the fastening pin 610 of each light source module 600 to be inserted into, e.g., through, the first portion 111 of the fastening hole 110.

Figure 16C:
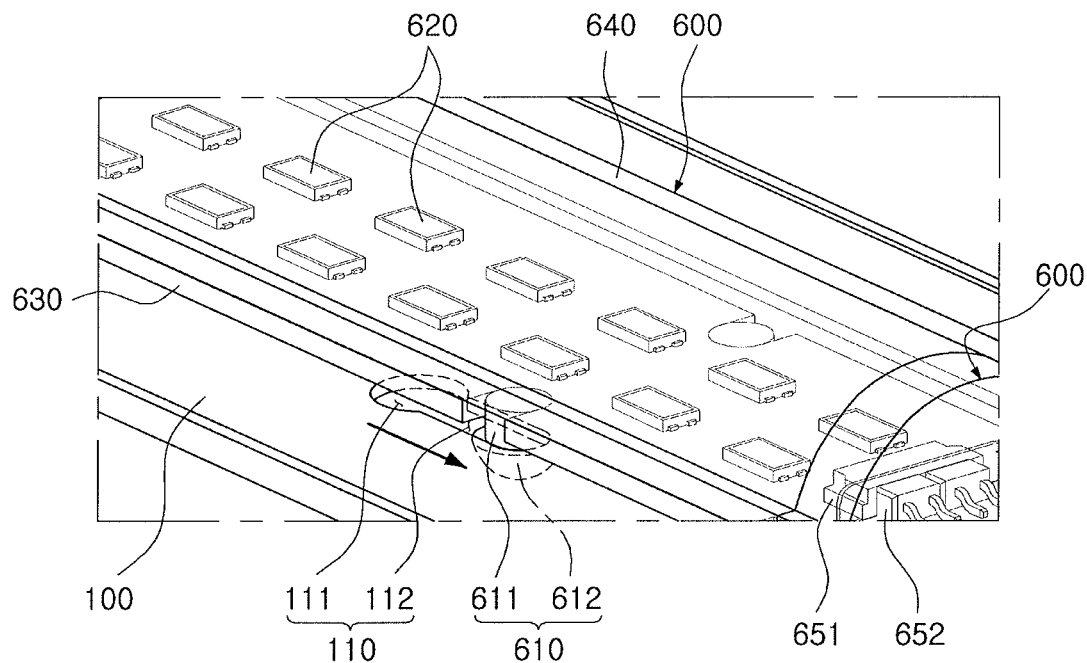

As illustrated in FIG. 16C, the two light source modules 600 may be slidably moved along a surface of the fixture 100 to allow the fastening pin 610 of each light source module 600 to be moved from the first portion 111 to the second portion 112 of the fastening hole 110. In other words, the two light source modules 600 are moved to slide along the surface of the fixture 100 (along the direction of the arrow in FIG. 16C), while the fastening pins 610 move within respective fastening holes 110, to allow the fastening pin 610 of each light source module 600 to be moved from the first portion 111 to the second portion 112.

The two light source modules 600 are slidably moved, e.g., simultaneously, toward each other to be electrically connected to each other through the connector 650 of each light source module 600. For example, the male connector 652 of the light source module 600 in one side may be fastened to the female connector 651 of the light source module 600 in the other side in a manner in which the male connector 652 is inserted into the female connector 651 (FIGS. 16A-16C). Thus, the two light source modules 600 may be electrically connected to each other and may be mechanically fixed to the fixture 100 simultaneously through sliding movements thereof.

Alternatively, the two light source modules 600 may be slidably moved, e.g., sequentially, toward each other. That is, a first light source module 600 of the two light source modules 600 may be fixed to the fixture 100 in advance through a sliding movement, followed by a second light source module 600 subsequently fixed to the fixture 100 through a sliding movement. The sliding movement of the second light source module 600 of the two light source modules 600 may cause the connector 650 of the second light source module 600 to be connected to a connector 650 of the first light source module 600, which is fixed in advance.

The light source modules 600 are fixed through a single process, i.e., a sliding-movement, so the light source modules 600 are simultaneously both electrically connected to each other and to the fixture 100. Thus, an entire manufacturing process may be simplified and the time required therefor may be reduced. In addition, a cabling process for a connection of light source modules, e.g., as compared to related art, may be omitted, thereby reducing costs and the time required for the cabling process.

Each of the lighting apparatuses 1, 2, and 3 may further include a driving circuit 700 according to an example embodiment, as will be described in more detail with reference to FIG. 17. The driving circuit 700 may include, e.g., a power supply unit (PSU).

Figure 17:
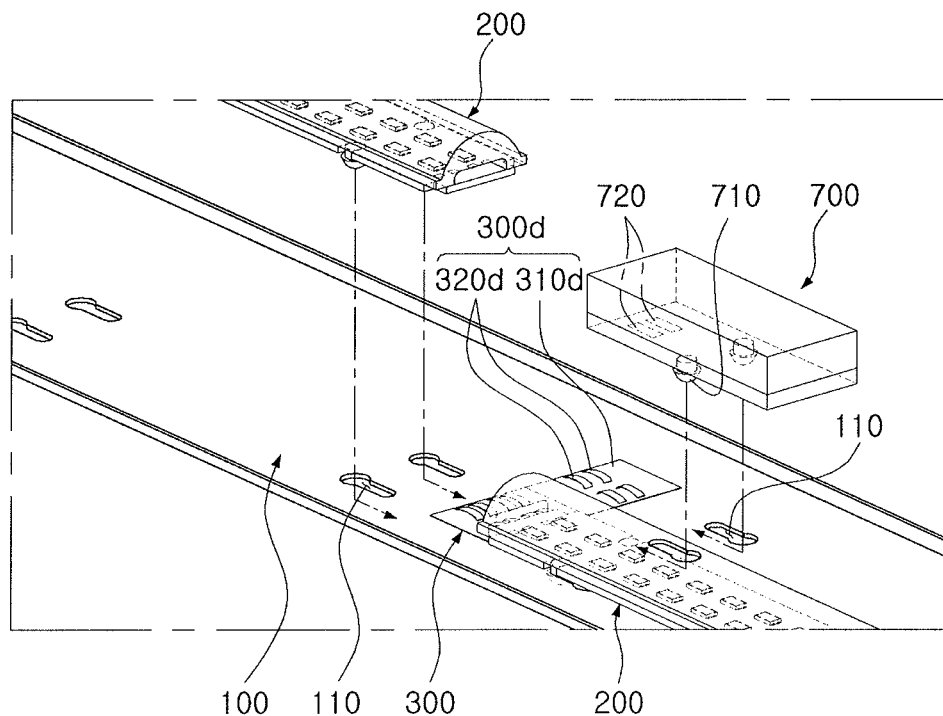
FIG. 17 illustrates a schematic, perspective view of a driving circuit mounted on a fixture.

FIG. 17 is a perspective view schematically illustrating the driving circuit 700 mounted on the fixture 100.

With reference to FIGS. 1 and 17, the fixture 100 may include the electrode terminal 300 connected to the light source module 200, and an electrode terminal 300d connected to the driving circuit 700. For example, the electrode terminal 300 and the electrode terminal 300d may be electrically connected to each other through a circuit pattern prepared inside of the body portions 310 and 310d, and surfaces thereof. For example, the body portions 310 and 310d of the respective electrode terminals 300 and 300d may be adjacent to each other on the surface of the fixture 100, as illustrated in FIG. 17.

The driving circuit 700 may have a fastening pin 710 and a pad 720 exposed externally, in a lower surface thereof. The driving circuit 700 may be mechanically fixed to the fixture 100, as the fastening pin 710 is slidably moved to be inserted into the fastening hole 110 of the fixture 100. In addition, the pad 720 may be in contact with a terminal portion 320d exposed through an upper portion of the body portion 310d of the electrode terminal 300d to be electrically connected to the terminal portion 320d. The driving circuit 700 and the light source module 200 may be electrically connected to each other through the electrode terminals 300 and 300d.

In an example embodiment, the driving circuit 700 may be simultaneously fixed to the fixture 100 in a simple slide fixing method, and may also form an electrical connection with the light source module 200. Thus, a separate cabling process for a connection of a PSU and a light source module, e.g., as compared to related art, may be omitted, thereby reducing manufacturing costs and time.

In an example embodiment, the driving circuit 700 is exemplified as being fixed to an upper surface of the fixture 100 in a manner similar to the light source module 200, but is not limited thereto. By way of example, the light source module 200 may be disposed on the upper surface of the fixture 100, and the driving circuit 700 may be disposed on a lower surface of the fixture 100.

Figure 18:
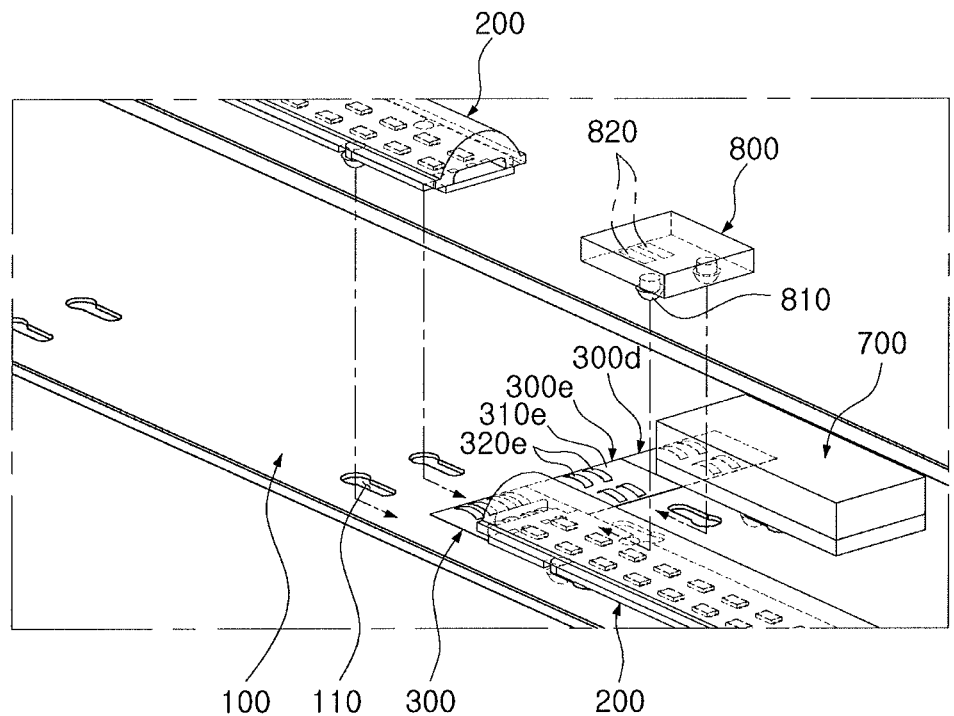
FIG. 18 illustrates a schematic perspective view of a sensor mounted on a fixture.

Each of the lighting apparatuses 1, 2, and 3 according to an example embodiment may further include a sensor 800 in addition to the driving circuit 700, as will be described in more detail below with reference to FIG. 18. FIG. 18 is a perspective view schematically illustrating the sensor 800 on the fixture 100.

With reference to FIG. 18, the fixture 100 may include an electrode terminal 300c connected to the sensor 800. The electrode terminals 300, 300d, and 300c, by way of example, may be electrically connected to each other through a circuit pattern prepared inside of body portions 310, 310d, and 310c, or a surface thereof.

The sensor 800 may have a fastening pin 810 and a pad 820 exposed externally, in a lower surface thereof. The sensor 800 is slidably moved while the fastening pin 810 is inserted into the fastening hole 110 of the fixture 100, to be mechanically fixed to the fixture 100. In addition, the pad 820 may be in contact with a terminal portion 320c exposed through an upper portion of the body portion 310c of the electrode terminal 300c to be electrically connected to the terminal portion 320c. The sensor 800 and the light source modules 200 may be electrically connected to each other through the electrode terminals 300, 300d, and 300c.

A communications module may be further combined with either of the lighting apparatuses 1, 2, and 3, in addition to the driving circuit 700 and the sensor 800. Home-network communications may be implemented through the communications module. In addition, various modules or components further performing a variety of additional functions may be properly and additionally combined therewith, in addition to a lighting function.

Figure 19A:
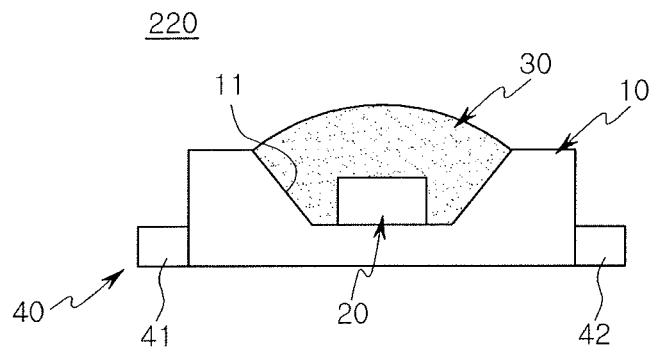
FIGS. 19A and 19B illustrate schematic cross-sectional views of examples of LED packages to be employed in a light emitting device according to embodiments, respectively.
Figure 19B:
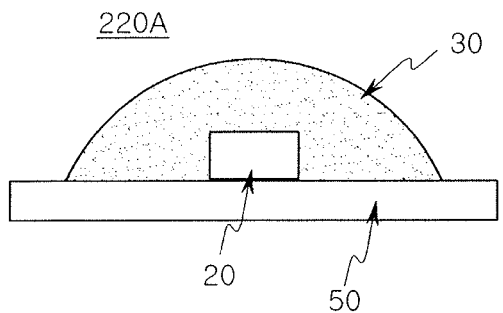

FIGS. 19A and 19B are cross-sectional views schematically illustrating example embodiments of a LED package to be employed as a light emitting device.

As described previously, the light emitting device 220 may be a LED chip or a LED package on which the LED chip is mounted. Hereinafter, a LED package having various structures to be employed as a light emitting device will be described.

For example, with reference to FIG. 19A, a LED package 220 according to an example embodiment may have a package structure in which a LED chip 20 is mounted inside of a package body 10 having a reflective cup. In addition, the LED chip 20 may be covered by an encapsulation portion 30 formed of a resin containing a phosphor.

The package body 10 may correspond to a base member on which the LED chip 20 is mounted to be supported thereby, and may be formed of a white molding compound having high light reflectivity. Thus, light emitted from the LED chip 20 is reflected to increase an amount of light emitted externally.

The white molding compound may include a thermosetting resin-based material having high heat resistance or a silicone resin-based material. In addition, a white pigment, a filler, a curing agent, a release agent, an antioxidant, an adhesion improving agent, or the like may be added to a thermoplastic resin-based material. In addition, the package body 10 may also be formed of FR-4, CEM-3, an epoxy material, a ceramic material, or the like. Further, the package body 10 may be formed of a metallic material.

The package body 10 may include a lead frame 40 for an electrical connection with an external power source. The lead frame 40 may be formed of a metallic material, having excellent electrical conductivity, e.g., aluminum (Al), copper (Cu), or the like.

The lead frame 40 may be disposed with a structure in which a pair of lead frames is separated from each other to oppose each other for electrical insulation. For example, the lead frame 40 may include a first lead frame 41 having first polarity and a second lead frame 42 having second polarity different from the first polarity. Here, the first polarity and the second polarity may be an anode and a cathode, or vice versa, respectively. In addition, the first lead frame 41 and the second lead frame 42 may be separated from each other to be electrically insulated from each other by the package body 10.

Bottom surfaces of the first lead frame 41 and the second lead frame 42 may be exposed externally through a bottom surface of the package body 10. Heat generated by the LED chip 20 may be emitted externally therethrough to improve heat radiation efficiency.

The package body 10 may have a reflective cup 11 recessed to a predetermined depth, in an upper surface thereof. The reflective cup 11 may have a cup structure having a tapered shape in which inner side surfaces are inclined toward a bottom surface of the package body 10. In addition, an area of an upper portion of the reflective cup 11 exposed to an upper surface of the package body 10 may be defined as a light-emitting surface of the LED package 220.

The first lead frame 41 and the second lead frame 42 may be partially exposed to a bottom surface of the reflective cup 11. The LED chip 20 may be electrically connected to the first lead frame 41 and the second lead frame 42.

The LED chip 20 may be an optoelectronic device generating light having a predetermined wavelength by driving power applied from an external source through the lead frame 40.

The LED chip 20 may emit blue light, green light, or red light according to a material contained therein or a combination thereof with a phosphor. The LED chip 20 may also emit white light, ultraviolet light, or the like.

The encapsulation portion 30 may cover the LED chip 20. The encapsulation portion 30 may be formed by curing a phosphor containing resin. For example, the encapsulation portion 30 may be formed of a transparent or semitransparent material to allow light generated by the LED chip 20 to be emitted externally, e.g., silicone, epoxy or the like.

In an example embodiment, the encapsulation portion 30 is exemplified as having a lens structure with a convex dome shape, but is not limited thereto. The encapsulation portion 30 may be formed to have a flat shape to correspond to the upper surface of the package body 10. In addition, a separate lens may be additionally attached to the upper surface thereof.

FIG. 19B schematically illustrates a modified example of the LED package 220. As illustrated in FIG. 19B, a LED package 220A, for example, may have a Chip on Board (COB) structure in which the LED chip 20 is mounted on a substrate 50. In addition, the LED chip 20 may be covered by the encapsulation portion 30 formed of a resin containing a phosphor.

Figure 20A:
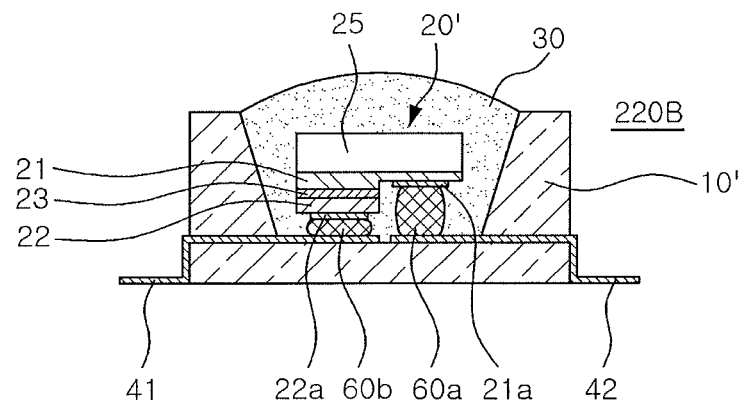
FIGS. 20A and 20B illustrate schematic cross-sectional views of examples of LED packages according to embodiments.
Figure 20B:
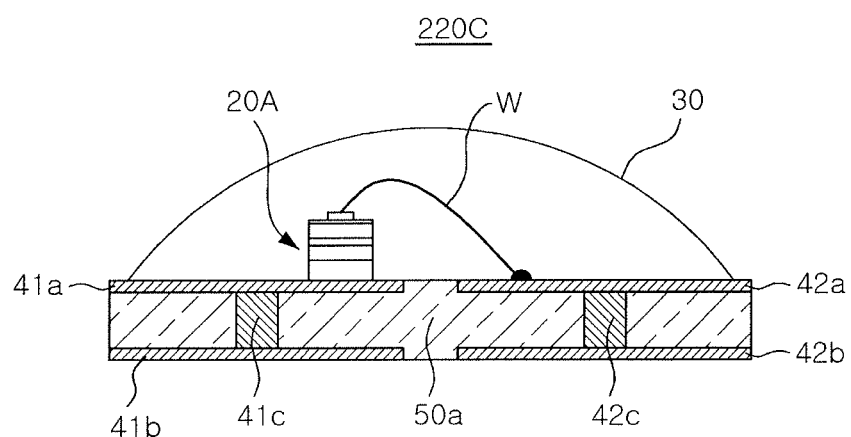

FIGS. 20A and 20B schematically illustrate LED packages according to example embodiments. FIGS. 20A and 20B are cross-sectional views schematically illustrating a LED package according to an example embodiment, respectively.

With reference to FIG. 20A, a LED package 220B may include a package body 10' and a LED chip 20' mounted on the package body 10'. For example, the LED chip 20' may include a substrate 25, a light emitting structure, and a first electrode 21a and a second electrode 22a disposed on the light emitting structure. The substrate 25 may be provided as a substrate for semiconductor growth, and may be formed of, for example, an electrical insulating and conductive material, e.g., sapphire, SiC, MgAl2O4, MgO, LiAlO2, LiGaO2, GaN, or the like.

The light emitting structure may include a first conductivity-type semiconductor layer 21 and a second conductivity-type semiconductor layer 22, and an active layer 23 disposed therebetween, but is not limited thereto. The first conductivity-type semiconductor layer 21 and the second conductivity-type semiconductor layer 22 may be an n-type semiconductor layer and a p-type semiconductor layer, respectively. In an example embodiment, the first conductivity-type semiconductor layer 21 and the second conductivity-type semiconductor layer 22 may be formed using a material represented by an empirical formula $Al_xIn_yGa_{(1-x-y)}N$ (where $0 \leq x < 1$, $0 \leq y < 1$, and $0 \leq x+y < 1$), e.g., GaN, AlGaN, InGaN, or the like. The active layer 23 disposed between the first conductivity-type semiconductor layer 21 and the second conductivity-type semiconductor layer 22 emits light having a predetermined level of energy by a recombination of electrons and holes. The active layer 23 may have a multiple quantum well (MQW) structure in which a quantum well layer and a quantum barrier layer are alternately stacked, e.g., an InGaN/GaN structure.

The first electrode 21a and the second electrode 22a may be formed on the first conductivity-type semiconductor layer 21 and the second conductivity-type semiconductor layer 22, respectively, and may be formed of a conductive material, e.g., one or more of silver (Ag), aluminum (Al), nickel (Ni), chromium (Cr), copper (Cu), gold (Au), palladium (Pd), platinum (Pt), tin (Sn), tungsten (W), rhodium (Rh), iridium (Ir), ruthenium (Ru), magnesium (Mg), zinc (Zn), titanium (Ti), and alloys thereof.

The package body 10' may include first and second lead frames 41 and 42. The package body 10' may perform a function of supporting the first and second lead frames 41 and 42, and may be formed of a resin in which opacity or reflectivity is great. For example, the package body 10' may be formed using a polymer resin of which an injection molding process is easily performed. However, a material of the package body 10' is not limited thereto, and may be formed of various nonconductive materials.

The first and second lead frames 41 and 42 may be formed of a metallic material having excellent electrical conductivity, and may be electrically connected to the first electrode 21a and the second electrode 22a of the LED chip 20' to transfer driving power applied from an external source to the LED chip 20'. Although not particularly limited, in an example embodiment, the first electrode 21a and the second electrode 22a of the LED chip 20' may be disposed to oppose the second lead frame 42 and the first lead frame 41, and may be electrically connected to each other by a medium of a first bump 60a and a second bump 60b. The LED chip 20' may be encapsulated by the encapsulation portion 30, e.g., formed by curing a phosphor containing resin discharged through a dispenser.

With reference to FIG. 20B, a LED package 220C according to an example embodiment may include a package substrate 50a and a LED chip 20A mounted on the package substrate 50a. The package substrate 50a may include upper pads 41a and 42a, lower pads 41b and 42b, and through vias 41c and 42c passing through the package substrate 50a to allow the upper pads 41a and 42a to be electrically connected to the lower pads 41b and 42b, respectively.

The LED chip 20A may include a light emitting structure, and first and second electrodes disposed on surfaces opposing each other, of the light emitting structure, respectively. The first electrode and the second electrode may have a vertical-type structure in which the first electrode and the second electrode are disposed on an upper surface and a lower surface of the light emitting structure, respectively.

For example, the LED chip 20A may be connected to the upper pad 41a, one of the upper pads 41a and 42a, through the second electrode disposed on a lower portion of the LED chip 20A, and may be connected to another upper pad 42a by a medium of a bonding wire w through the first electrode disposed on an upper portion thereof. The LED chip 20A may be encapsulated by the encapsulation portion 30 formed by curing a phosphor containing resin discharged through a dispenser.

Figure 21A:
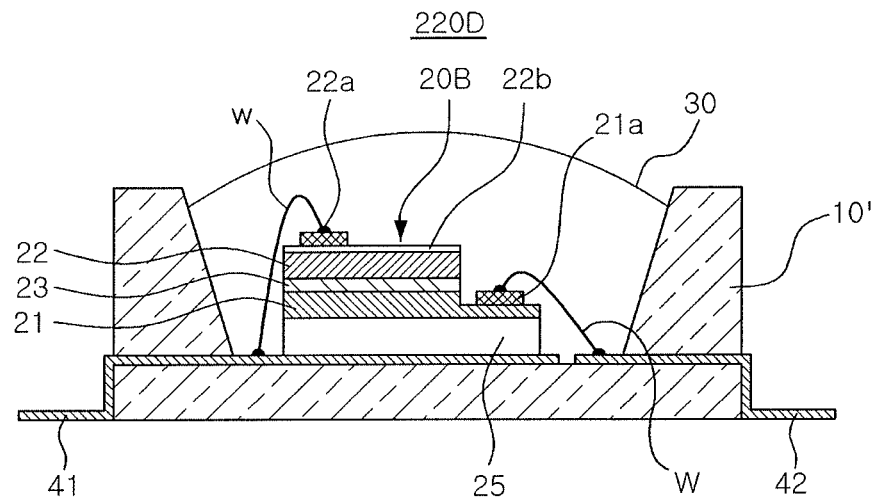
FIGS. 21A and 21B illustrate schematic cross-sectional views of examples of LED packages according to embodiments.
Figure 21B:
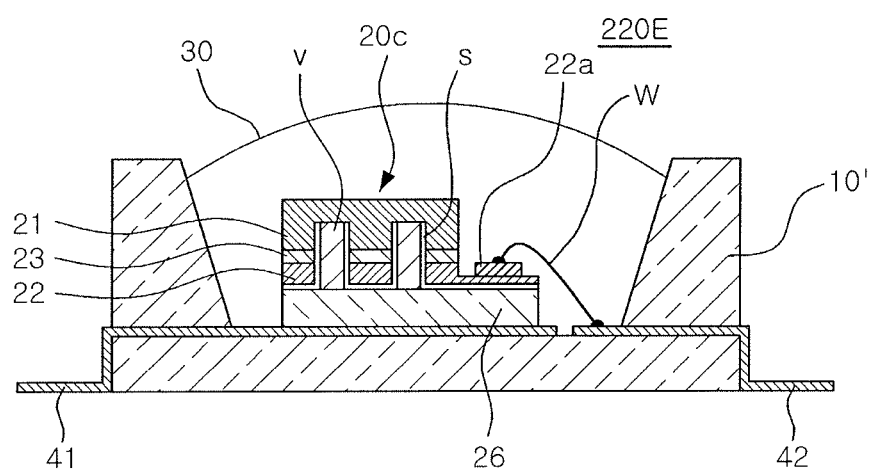

FIGS. 21A and 21B schematically illustrate LED packages according to example embodiments. FIGS. 21A and 21B are cross-sectional views schematically illustrating LED packages according to example embodiments.

A LED package 220D illustrated in FIG. 21A may include a LED chip 20B and the package body 10'. The package body 10' may include the first lead frame 41 and the second lead frame 42. The LED chip 20B may include the substrate 25 and a light emitting structure, which is disposed on the substrate 25 and on which a first electrode 21a and a second electrode 22a are formed.

The light emitting structure may include a first conductivity-type semiconductor layer 21, a second conductivity-type semiconductor layer 22, and an active layer 23 disposed therebetween. A transparent electrode layer 22b may be disposed between the second conductivity-type semiconductor layer 22 and the second electrode 22a.

In the LED package 220D according to an example embodiment, the first electrode 21a and the second electrode 22a may not be disposed to oppose the first lead frame 41 and the second lead frame 42, and may be electrically connected to the first lead frame 41 and the second lead frame 42 through the bonding wire w, in a manner different from the LED package 220B illustrated in FIG. 20A. The LED chip 20B may be encapsulated by the encapsulation portion 30 formed by curing a phosphor containing resin discharged through a dispenser.

A LED chip 20C provided in a LED package 220E illustrated in FIG. 21B may include a conductive substrate 26 and a light emitting structure disposed on the conductive substrate 26. The light emitting structure may include a first conductivity-type semiconductor layer 21, an active layer 23, and a second conductivity-type semiconductor layer 22.

In the example embodiment, the light emitting structure may include a conductive via v passing through the second conductivity-type semiconductor layer 22 and the active layer 23 to be connected to the first conductivity-type semiconductor layer 21. An insulating portion s may be formed on lateral surfaces of the conductive via v to prevent undesired electrical short circuits. The conductive via v may be electrically connected to the conductive substrate 26, and thus, the conductive substrate 26 may perform a function substantially the same as a first electrode connected to the first conductivity-type semiconductor layer 21.

The second electrode 22a may be provided on the second conductivity-type semiconductor layer 22. The conductive via v may be electrically connected to the first lead frame 41, and the second electrode 22a may be electrically connected to the second lead frame 42 through a bonding wire w. In this case, more uniform level of current may be provided to the light emitting structure through the conductive via v.

Figure 22:
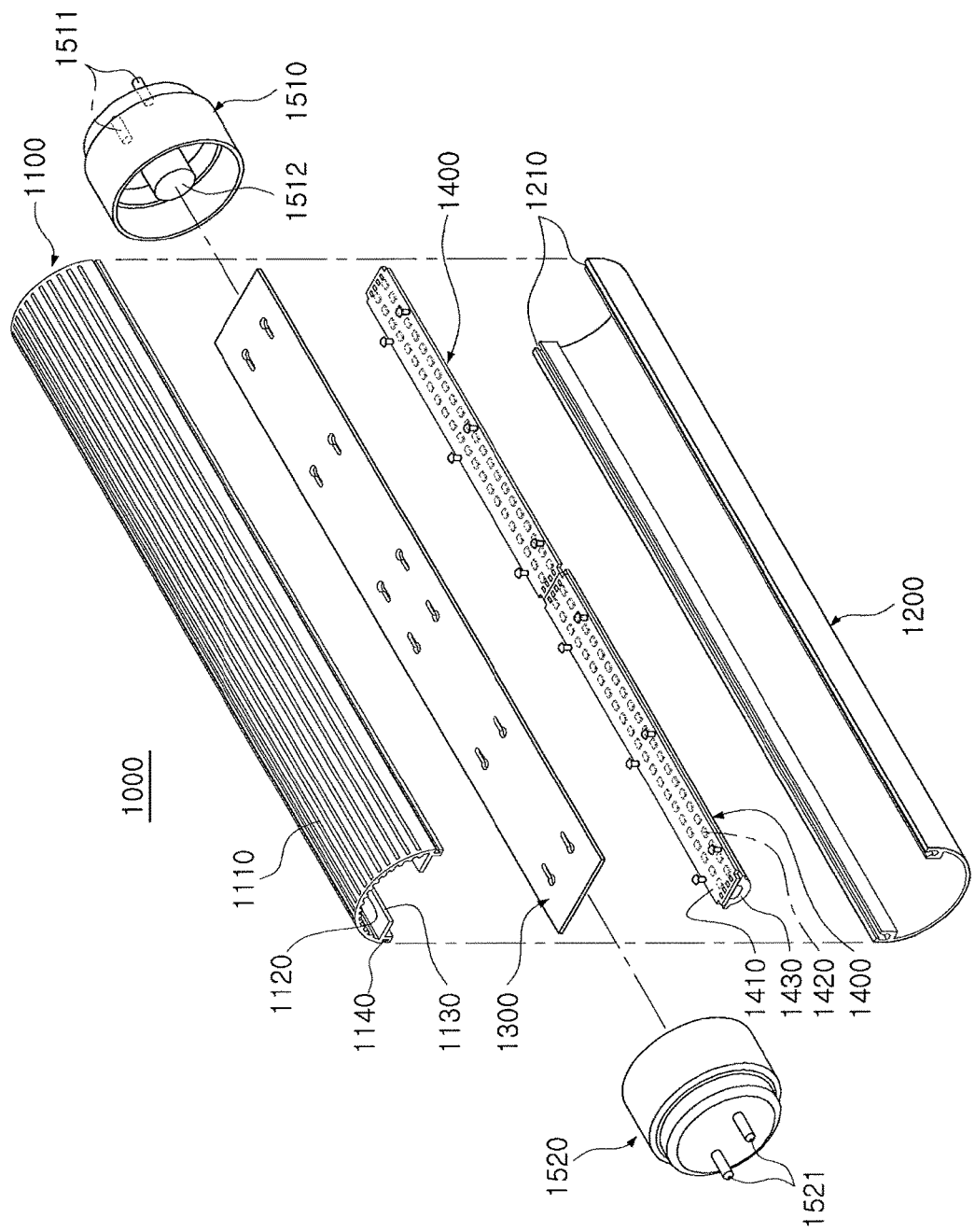
FIG. 22 illustrates an exploded perspective view of a bar type lamp in which a light source module according to an example embodiment is employed.

FIG. 22 is an exploded perspective view schematically illustrating a bar type lamp, as a lighting apparatus according to an example embodiment.

With reference to FIG. 22, a lighting apparatus 1000 may include a heat radiating member 1100, a cover 1200, a fixture 1300, light source modules 1400, a first socket 1510, and a second socket 1520. A plurality of heat radiating fins 1110 and 1120 may be formed in a concave-convex form inside of the heat radiating member 1100 or/and an outer surface thereof, and the heat radiating fins 1110 and 1120 may be designed to have various forms and intervals.

A support 1130 having a protruding form is formed inside of the heat radiating member 1100. The fixture 1300 may be fixed to the support 1130. In the example embodiment, the fixture 1300 and the heat radiating member 1100 are exemplified as being individual configurations separated from each other, but are not limited thereto. For example, the fixture 1300 and the heat radiating member 1100 may be integrated with each other. Stop protrusions 1140 may be formed on both ends of the heat radiating member 1100.

In the example embodiment, the fixture 1300 may have a structure substantially corresponding to the fixture 100 in FIG. 1. Thus, detailed descriptions of the fixture 1300 may be understood with reference to example embodiments described previously, and the detailed descriptions thereof are omitted.

Stop grooves 1210 may be formed in the cover 1200, and stop protrusions 1140 of the heat radiating member 1100 may be combined with the stop grooves 1210, with a hook coupling structure. Positions, in which the stop grooves 1210 and the stop protrusions 1140 are formed, may be changed.

The light source modules 1400 may be detachably fastened to the fixture 1300. The light source module 1400 may include a substrate 1410, a plurality of light emitting devices 1420, and an optical element 1430.

In an example embodiment, the light source module 1400 may have a structure substantially corresponding to light source modules 200, 400, and 600 in FIGS. 1 to 18. Thus, detailed descriptions of each component of the light source module 1400 may be understood with reference to example embodiments described previously, and the detailed descriptions thereof are omitted.

The first socket 1510 and the second socket 1520 may be provided as a pair of sockets, and may have a structure in which they are coupled to two ends of a cylindrical cover unit formed of the heat radiating member 1100 and the cover 1200. For example, the first socket 1510 may include electrode terminals 1511 and a power supply device 1512, and the second socket 1520 may include dummy terminals 1521 disposed thereon.

In addition, an optical sensor and/or a communications module may be mounted on the lighting apparatus 1000 according to an example embodiment. The optical sensor and/or the communications module may be mounted on the substrate 1410 of the light source module 1400 with the light emitting device 1420, or mounted on the fixture 1300 with the light source module 1400. Alternatively, the optical sensor and/or the communications module may be embedded in one of the first socket 1510 and the second socket 1520. For example, the optical sensor and/or the communications module may be embedded in the second socket 1520 on which the dummy terminals 1521 are disposed.

The lighting apparatus 1000 may implement home-network communications through a communications module. For example, the communications module may be a wireless communications module using Zigbee®, Wi-Fi, or Li-Fi, and may control illumination of a lighting apparatus installed indoors or outdoors, such as on/off operations, brightness adjustments, or the like, through a smartphone or a wireless controller. In addition, an electronic device located indoors or outdoors, e.g., a TV, a refrigerator, an air conditioner, a door lock, or the like, as well as a vehicle, may be controlled using a Li-Fi communications module using light having a visible wavelength from a lighting apparatus installed indoors or outdoors.

According to an example embodiment, an Internet of Things (IoT) device has an accessible wired or wireless interface, may be in communication with one or more other devices through a wired/wireless interface, and may include devices for transmitting or receiving data. The accessible interface may include a wired local area network (LAN), a wireless local area network (WLAN) such as wireless fidelity (Wi-Fi), wireless personal area network (WPAN) such as Bluetooth, wireless universal serial bus (wireless USB), Zigbee®, near field communications (NFC), radio-frequency identification (RFID), power line communications (PLC), a modem communications interface accessible to a mobile communications network (mobile cellular network) such as a 3rd generation (3G) network, a 4th Generation (4G) network, a long term evolution (LTE) network, or the like. The Bluetooth interface may support Bluetooth low energy (BLE).

By way of summation and review, a lighting device may be manufactured using processes of fastening substrates, on which a light emitting device is mounted, to a frame, and additionally fastening an optical element, e.g., a lens covering the light emitting device, or the like, to the frame. In this case, the fastening of the substrate and the optical element may be performed using a screw fastening method, and a number of screws may be individually provided in a number of positions.

Therefore, the multiple processes required to assemble the light emitting device may be difficult and inconvenient. In addition, when a defect occurs in the light emitting device, an already assembled screw may be removed to allow repair of the defect, e.g., to allow separation of the light emitting device from the substrate, thereby causing lengthy and difficult maintenance. Further, a cabling process may be additionally required to electrically connect substrates to each other, thereby further complicating a manufacturing process and increasing costs and time.

In contrast, embodiments provide a lighting apparatus allowing light source modules to be easily mounted and electrically connected simultaneously via a single process. That is, as set forth above, the lighting apparatus according to embodiments may be easily mounted and electrically connected through a standardized light source module, which includes a protrusion protruding from a primary optic to be combined with a PCB. The protrusion protrudes from the primary optic and is fastened to a groove in a fixture, and the primary optic with the PCB slide on the surface of the fixture within the groove to be simultaneously fixed to the fixture and electrically connected to an adjacent PCB of a different module via a connector.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A lighting apparatus, comprising:
   a fixture having a fastening hole, the fastening hole including a first portion and a second portion connected to each other, and the second portion having a width smaller than a diameter of the first portion;
   a light source module having a fastening pin detachably fastened to the fastening hole; and
   an electrode terminal on the fixture and connected to the light source module,
   wherein the light source module is slidably moveable along a surface of the fixture to simultaneously affix to the fixture and electrically connect with the electrode terminal, as the fastening pin moves within the fastening hole from the first portion to the second portion,
   wherein the light source module includes a plurality of light emitting devices on a substrate, and an optical element having the fastening pin fastened to the substrate, and
   wherein the substrate includes electrode pads at opposite ends thereof, the electrode pads overlapping and being electrically connected to the electrode terminal only when the fastening pin is in the second portion.

2. The lighting apparatus as claimed in claim 1, wherein:
   the optical element is on the substrate to cover the plurality of light emitting devices, and
   the fastening pin extends from a bottom surface of the optical element toward the substrate.

3. The lighting apparatus as claimed in claim 1, wherein the fastening pin includes a rod extending from the optical element, and a stop protrusion radially protruding from an end of the rod.

4. The lighting apparatus as claimed in claim 3, wherein:
   the rod has a diameter smaller than the diameter of the first portion and than the width of the second portion, and
   the stop protrusion has a diameter smaller than the diameter of the first portion and greater than the width of the second portion.

5. The lighting apparatus as claimed in claim 1, wherein the substrate includes an insertion groove, the fastening pin being inserted into the insertion groove.

6. The lighting apparatus as claimed in claim 1, wherein the electrode pads are exposed through a surface of the substrate at the opposite ends of the substrate.

7. The lighting apparatus as claimed in claim 1, wherein the electrode terminal includes a body portion detachably connected to the fixture, and a terminal portion partially exposed through the body portion.

8. The lighting apparatus as claimed in claim 1, wherein the electrode terminal includes:
- a pair of contact parts protruding from the fixture and having a structure of a plate spring; and
- a connection part connecting the pair of contact parts to each other.

9. The lighting apparatus as claimed in claim 8, wherein the pair of contact parts of the electrode terminal is aligned along a straight line with the connection part, or the pair of contact parts has a zigzag shape with respect to the connection part.

10. The lighting apparatus as claimed in claim 1, further comprising a driving circuit connected to the electrode terminal.

11. A lighting apparatus, comprising:
- a fixture having a fastening hole;
- a light source module including a plurality of light emitting devices on a first surface of a substrate;
- a fastening pin protruding from the substrate to be detachably fastened to the fastening hole; and
- an electrode terminal on the fixture,
- wherein the substrate is slidably moveable on a surface of the fixture, while the fastening pin is moveable within the fastening hole to be fastened to the fastening hole, and the electrode terminal is connected to the light source module only when the fastening pin is fastened to the fastening hole,
- wherein the light source module includes an optical element having the fastening pin fastened to the substrate, and
- wherein the substrate includes electrode pads at opposite ends thereof, the electrode pads overlapping and being electrically connected to the electrode terminal only when the fastening pin is fastened to the fastening hole.

12. The lighting apparatus as claimed in claim 11, wherein the fastening pin protrudes from a second surface of the substrate, the second surface of the substrate being opposite to the first surface of the substrate, and the fastening pin protruding away from the plurality of light emitting devices.

13. The lighting apparatus as claimed in claim 11, further comprising a cover covering the light source module.

14. A lighting apparatus, comprising:
- a fixture having a fastening hole, the fastening hole including a first portion and a second portion connected to each other, and the second portion having a width smaller than a diameter of the first portion;
- a light source module on the fixture, the light source module having a fastening pin detachably fastened to the fastening hole in the fixture, the fastening pin being moveable within the fastening hole from the first portion to the second portion; and
- an electrode terminal on the fixture,
- wherein the light source module is mechanically fixed with the fixture and the electrode terminal is electrically connected to the light source module only when the fastening pin is in the second portion,
- wherein the light source module includes a plurality of light emitting devices on a substrate, and an optical element having the fastening pin fastened to the substrate, and
- wherein the substrate includes electrode pads at opposite ends thereof, the electrode pads overlapping and being electrically connected to the electrode terminal only when the fastening pin is in the second portion.

15. The lighting apparatus as claimed in claim 14, further comprising a cover covering the light source module.

16. The lighting apparatus as claimed in claim 14, wherein the optical element covers the plurality of light emitting devices, and the fastening pin is attached to the optical element and extending from the optical element through the substrate toward the fixture.

\* \* \* \* \*